United States Patent
Ghantous et al.

(10) Patent No.: US 11,079,212 B2
(45) Date of Patent: Aug. 3, 2021

(54) CIRCUITRY AND TECHNIQUES FOR DETERMINING SWELLING OF A BATTERY/CELL AND ADAPTIVE CHARGING CIRCUITRY AND TECHNIQUES BASED THEREON

(71) Applicant: Qnovo Inc., Newark, CA (US)

(72) Inventors: Dania Ghantous, Walnut Creek, CA (US); Allison Pinoli, Sunnyvale, CA (US); Lawrence Pan, Pleasanton, CA (US); David Coakley, San Jose, CA (US); Bryan McLaughlin, San Francisco, CA (US)

(73) Assignee: Qnovo Inc., Newark, CA (US)

( * ) Notice: Subject to any disclaimer, the term of this patent is extended or adjusted under 35 U.S.C. 154(b) by 1137 days.

(21) Appl. No.: 14/921,886

(22) Filed: Oct. 23, 2015

(65) Prior Publication Data

US 2016/0116548 A1    Apr. 28, 2016

Related U.S. Application Data

(60) Provisional application No. 62/068,345, filed on Oct. 24, 2014.

(51) Int. Cl.
*H01M 10/44* (2006.01)
*G01R 31/367* (2019.01)
(Continued)

(52) U.S. Cl.
CPC .............. *G01B 7/22* (2013.01); *H01M 10/44* (2013.01); *G01R 31/367* (2019.01); *G01R 31/382* (2019.01)

(58) Field of Classification Search
CPC .............. H01M 10/44; G01R 31/3606; G01R 31/3651; G01B 7/22
(Continued)

(56) References Cited

U.S. PATENT DOCUMENTS 6,232,750 B1 * 5/2001 Podrazhansky ............... 320/139
8,854,012 B2 10/2014 Dai et al.
(Continued)

FOREIGN PATENT DOCUMENTS

CN    1463476 A    12/2003
CN    1767232 A    5/2006
(Continued)

OTHER PUBLICATIONS

U.S. Appl. No. 14/252,422, Apr. 14, 2014, Berkowitz et al.
(Continued)

*Primary Examiner* — John E Breene
*Assistant Examiner* — Xiuqin Sun
(74) *Attorney, Agent, or Firm* — Weaver Austin Villeneuve & Sampson LLP

(57) ABSTRACT

Disclosed are methods and systems for measuring and managing swelling of rechargeable batteries in situ. Some implementations involve using capacity fade or state of health of rechargeable batteries to estimate swelling of the rechargeable batteries. Some implementations provide methods and systems for measuring battery swelling based on inductive or capacitive coupling between sensors and the battery. Some implementations provide means to manage or reduce swelling of rechargeable batteries by applying adaptive charging with consideration of battery swelling.

18 Claims, 20 Drawing Sheets

(51) Int. Cl.
  *G01R 31/382* (2019.01)
  *G01B 7/16* (2006.01)
(58) Field of Classification Search
  USPC .......................................................... 702/63
  See application file for complete search history.

(56) References Cited

U.S. PATENT DOCUMENTS

| | | | |
|---|---|---|---|
| 8,941,289 B2 | 1/2015 | Hirabayashi et al. | |
| 8,970,178 B2 | 3/2015 | Berkowitz et al. | |
| 9,035,623 B1 | 5/2015 | Berkowitz et al. | |
| 9,063,018 B1 | 6/2015 | Ghantous et al. | |
| 9,121,910 B2 | 9/2015 | Maluf et al. | |
| 9,142,994 B2 | 9/2015 | Berkowitz et al. | |
| 9,255,973 B2* | 2/2016 | Song | G01R 31/367 |
| 9,263,900 B2* | 2/2016 | Ju | B60L 58/15 |
| 9,461,492 B1 | 10/2016 | Berkowitz et al. | |
| 9,917,335 B2* | 3/2018 | Jarvis | H01M 10/4257 |
| 10,809,049 B2 | 10/2020 | Ghantous et al. | |
| 2010/0164430 A1* | 7/2010 | Lu | H01M 16/00 320/103 |
| 2011/0285356 A1* | 11/2011 | Maluf | H02J 7/0052 320/139 |
| 2012/0025771 A1* | 2/2012 | Bhardwaj | H02J 7/047 320/128 |
| 2013/0082569 A1 | 4/2013 | Hirabayashi et al. | |
| 2013/0300347 A1* | 11/2013 | Xu | H02J 7/0052 320/107 |
| 2013/0323554 A1 | 12/2013 | Heubner et al. | |
| 2015/0340744 A1 | 11/2015 | Knobloch et al. | |
| 2018/0149462 A1 | 5/2018 | Ghantous et al. | |

FOREIGN PATENT DOCUMENTS

| | | |
|---|---|---|
| CN | 102138248 A | 7/2011 |
| CN | 104020422 A | 9/2014 |
| TW | 201407179 A | 2/2014 |
| WO | 2012/135148 | 10/2012 |

OTHER PUBLICATIONS

U.S. Office Action dated May 15, 2018 issued U.S. Appl. No. 15/879,344.
U.S. Appl. No. 15/879,344, filed Jan. 24, 2018, Ghantous et al.
U.S. Appl. No. 15/234,995, filed Aug. 11, 2016, Berkowitz et al.
U.S. Final Office Action dated Jan. 4, 2019 issued U.S. Appl. No. 15/879,344.
U.S. Office Action dated Jun. 10, 2019 issued U.S. Appl. No. 15/879,344.
Chinese Office Action dated Mar. 28, 2019 issued in CN 201510700981.5.
U.S. Final Office Action dated Jan. 20, 2020 issued U.S. Appl. No. 15/879,344.
Chinese Office Action dated Feb. 3, 2020 issued in CN 201510700981.5.
U.S. Notice of Allowance dated Jun. 23, 2020 issued in U.S. Appl. No. 15/879,344.
Chinese Office Action dated Oct. 10, 2020 issued in CN 201510700981.5.
CN Decision of Rejection dated Mar. 3, 2021 issued in CN Application No. 201510700981.5.

* cited by examiner

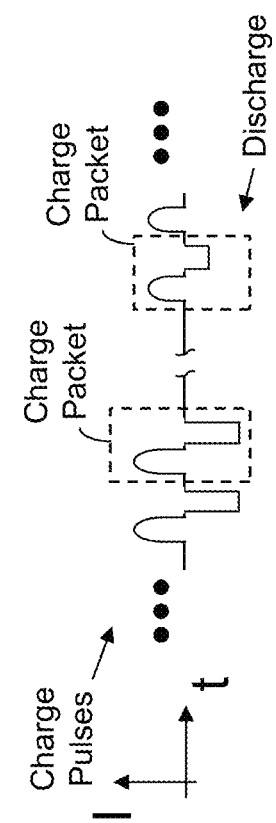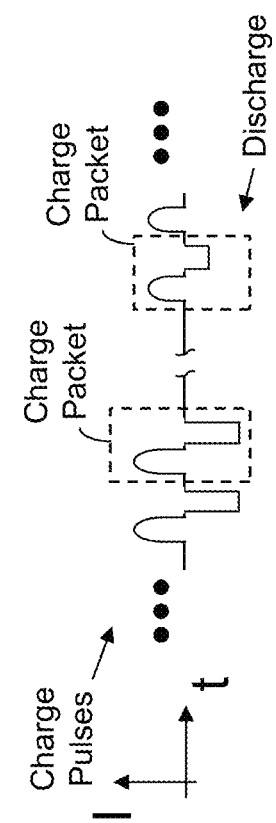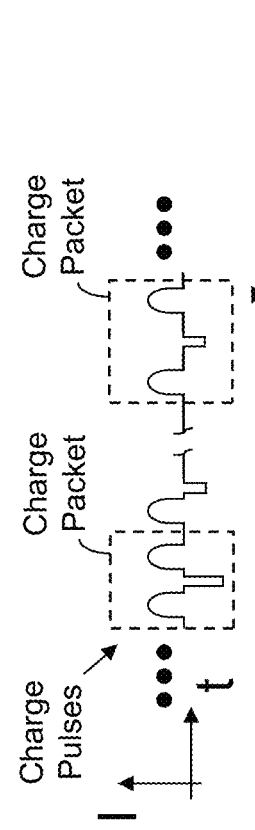

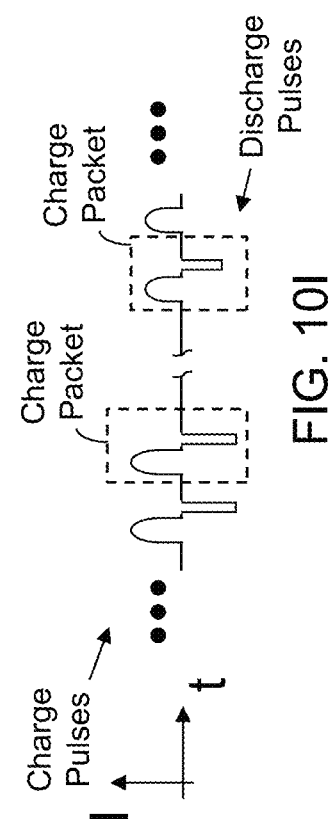
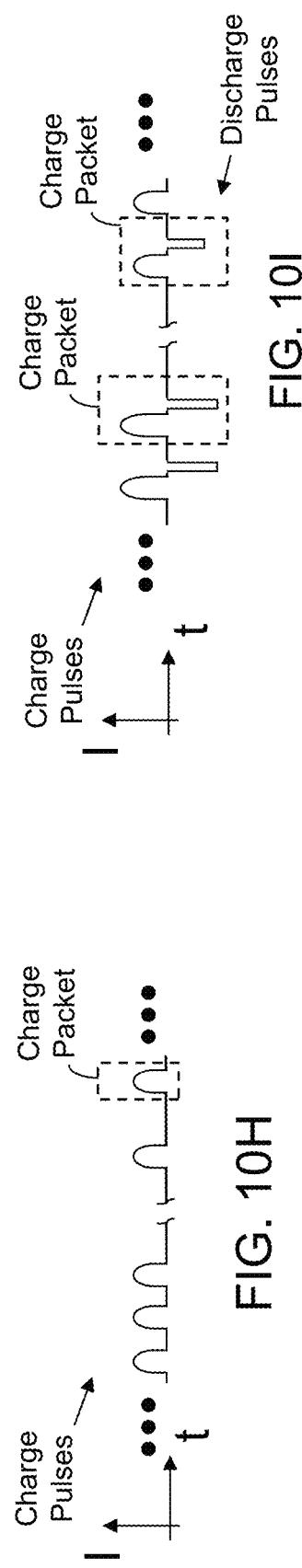
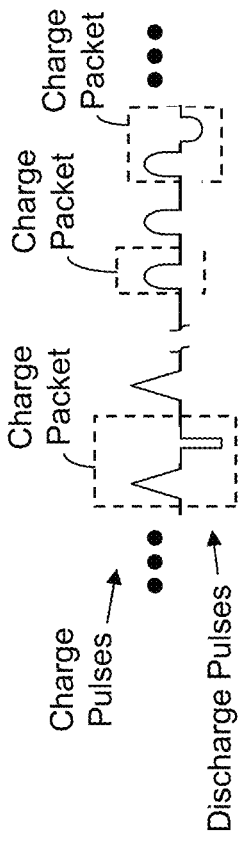
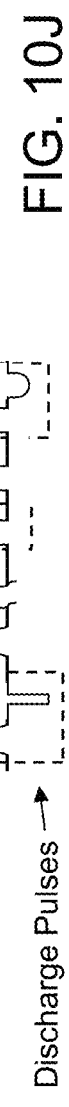
FIG. 10F
FIG. 10G
FIG. 10H
FIG. 10I
FIG. 10J

CIRCUITRY AND TECHNIQUES FOR DETERMINING SWELLING OF A BATTERY/CELL AND ADAPTIVE CHARGING CIRCUITRY AND TECHNIQUES BASED THEREON

CROSS REFERENCE TO RELATED APPLICATIONS

This application claims benefits under 35 U.S.C. § 119(e) to U.S. Provisional Patent Application No. 62/068,345, entitled: CIRCUITRY AND TECHNIQUES FOR DETERMINING SWELLING OF A BATTERY/CELL AND ADAPTIVE CHARGING CIRCUITRY AND TECHNIQUES BASED THEREON, filed Oct. 24, 2014, which is herein incorporated by reference in its entirety for all purposes.

TECHNICAL FIELD

This disclosure relates to technology for measuring and managing battery swelling. In particular, some embodiments provide methods and systems for estimating battery swelling based on capacity fade or state of health of rechargeable batteries. Other embodiments involve measuring battery swelling using capacitive or inductive sensors. Systems and methods for managing battery swelling by adaptive charging are also provided.

DESCRIPTION OF THE RELATED TECHNOLOGY

Batteries are widely used in many consumer electronics and other applications such as electric cars and electronic instruments. For many applications, swelling of the batteries can cause problems, because these applications require small and thin products (e.g., in cell phones) or a large number of batteries assembled in a tight space (e.g., in electric cars). A battery can take up the majority of one or more physical dimensions of a cell phone, for example. If the battery swells during its life, which is common with battery technologies, the phone may break or become functionally/structurally compromised if there is not enough extra space to accommodate the swelling. For example, if the mobile device manufacturers make a larger or thicker mobile device to accommodate the swelling of the battery, such a device has less desirable consumer specifications. Therefore, it is desirable to monitor and manage battery swelling in these applications. This disclosure provides methods, systems, and products for monitoring or managing battery swelling that may be implemented in various applications.

SUMMARY

In some embodiments, methods and apparatus are provided for estimating swelling in a battery by determining capacity face and/or state of health. In some embodiments, methods and apparatus are provided using information about battery swelling to adapt a charging process to, for example, reduce swelling or future increases in swelling.

One aspect of the disclosure relates to methods for estimating swelling of a rechargeable battery. In some implementations, the method involves: determining capacity fade of the rechargeable battery in use; and estimating swelling of the rechargeable battery using the determined capacity fade of the rechargeable battery.

In some implementations, estimating the swelling involves applying a relationship for predicting battery swelling from battery capacity fade. In some implementations, the method further involves: storing the relationship in a memory; and retrieving the relationship from memory for estimating the swelling. In some implementations, the relationship was obtained by: (i) charging and discharging one or more sample rechargeable batteries for one or more charge cycles; (ii) measuring capacity fade of the one or more sample rechargeable batteries; (iii) measuring swelling of the one or more sample rechargeable batteries; (iv) repeating (i)-(iii) one or more times, thereby obtaining two or more data points corresponding to capacity fade and swelling in two or more charge cycles for the one or more sample rechargeable batteries; and (v) forming the relationship for predicting battery swelling from battery capacity fade using the two or more data points. In some implementations, determining capacity fade of a rechargeable battery involves determining capacity fade in two or more charge cycles.

In some implementations, the method further involves adjusting a charging sequence for the rechargeable battery based at least in part on the estimated swelling of the rechargeable battery.

In some implementations, adjusting the charging sequence reduces the estimated swelling of the rechargeable battery. In some implementations, adjusting the charging sequence may involve operations such as: reducing an amplitude of a charge pulse, terminating the charging sequence, reducing the pulse width, applying one or more negative pulses, increasing an amplitude of a negative pulse, increasing a width of a negative pulse, increasing a duration of a rest period, and changing a timing of a rest period. In some implementations, adjusting the charging sequence involves adjusting one or more aspects of the charging sequence involves adjusting one or more aspects of a charge or discharge pulse selected from the group consisting of: a shape of the pulse, an amplitude of the pulse, a duration of the pulse, a duty cycle a sequence of pulses, and a rest period between the pulses. In some implementations, adjusting the charging sequence involves adjusting one or more characteristics of a charging signal of a constant-current, constant-voltage (CCCV) charging technique or a step charging technique. In some implementations, adjusting the charging sequence involves adjusting an amplitude of a charge current or a number of steps of charge current.

In some implementations, adjusting the charging sequence involves: determining that the swelling of the battery exceeds a predetermined range or value and performing one or more of the following operations: reducing an amplitude of a charge current, terminating the charging sequence, increasing a number of charge steps over a charge period, adjusting a step width of one or more charge steps, introducing one or more negative pulses, or adjusting an amplitude or pulse width of one or more negative pulses. In some implementations, adjusting the charging sequence involves terminating a charging sequence when the SOC of the battery reaches 85% or lower of a previous or initial SOC of the battery. In some implementations, adjusting the charging sequence is at least partially based on one or more of the following parameters: an over-potential (OP) of the battery, a full relaxation time (FRT) of the battery, a charge pulse voltage (CPV), a change in CPV, a partial relaxation time (PRT) of the battery, a temperature of the battery/cell (T° b/c), a temperature of the charging circuitry (T° cc), a temperature of the housing (T° h), a maximum current applied to the battery during charging operations (Imax), and a maximum terminal voltage during charging operations (Vmax).

Another aspect of the disclosure relates to a method for determining a relationship for predicting swelling of batteries from capacity fade of the batteries. The method involves: (a) charging and discharging one or more rechargeable batteries for one or more charge cycles; (b) measuring capacity fade of the one or more rechargeable batteries; (c) measuring swelling of the one or more rechargeable batteries; (d) repeating (a)-(c) one or more times, thereby obtaining two or more data points corresponding to capacity fade and swelling in two or more charge cycles for the one or more rechargeable batteries; (e) determining the relationship for predicting battery swelling from battery capacity fade using the two or more data points; and (f) storing data describing the relationship in a memory. In some implementations, the relationship includes a mathematical relationship between the capacity fade and swelling. In some implementations, determining a relationship involves fitting the mathematical relationship to the two or more data points. In some implementations, the relationship includes a look-up table. In some implementations, the one or more rechargeable batteries include two or more rechargeable batteries, and wherein determining a relationship includes averaging data points from the two or more rechargeable batteries to obtain averaged data.

An additional aspect of the disclosure relates to another system for estimating swelling of a rechargeable battery, the system involves: (a) a charging circuitry configured to apply a charging sequence for the rechargeable battery; (b) a measurement circuitry configured to measure voltage or charge passing at terminals of the rechargeable battery; and (c) logic configured to: determine capacity fade of the rechargeable battery in use, wherein the logic determines capacity fade using measured voltage and/or charge from the measurement circuitry; and estimate swelling of the rechargeable battery using the determined capacity fade of the rechargeable battery. In some implementations, estimating the swelling involves applying the determined capacity fade to a relationship for predicting battery swelling from battery capacity fade. In some implementations, the logic is further configured to adjust the charging sequence, applied by the charging circuitry, based at least in part on the estimated swelling of the rechargeable battery.

A further aspect of the disclosure relates to a system for estimating swelling of batteries. The system includes one or more inductive or capacitive sensors disposed proximate to a surface of a battery or integrated in or on a non-metallic surface above a metallic component of the battery. The system also includes an electronic circuitry configured to obtain proximity data indicating a change of inductive and/or capacitive coupling between the one or more sensors and said surface or said metallic component; and calculate a displacement of said surface or said metallic component from the proximity data, thereby estimate swelling of the battery. In some implementations, the one or more sensors include one or more inductive sensors that each includes a coil to carry a current to induce eddy currents to generate an eddy-current magnetic field. In some implementations, the coil is incorporated as part of a resonator. In some implementations, the one or more inductive sensors include one or more parallel capacitors. In some implementations, the system further includes a sensor target element on or in an external surface of the battery proximate to the one or more sensors. In some implementations, the electronic circuitry is configured to apply an averaging function, a minimum function, or a maximum function to the proximity data. In some implementations, the electronic circuitry is configured to apply corrections to the proximity data based on temperature, charge time, charge current, charge voltage, state of charge, or state of health. In some implementations, the system further includes an array of multiplexers, wherein the one or more sensors include a plurality of sensors, and wherein the system wherein the electronic circuit is further configured to control the multiplexers to manage which sensors are used.

A related aspect of the disclosure relates to a method for estimating swelling of a rechargeable battery. The method involves: measuring a change of inductance or capacitance between one or more inductive or capacitive sensors and a surface of the battery or a metallic component of the battery; calculating a displacement of said surface or said metallic component from the change of inductance or capacitance, and estimating swelling of the battery from the displacement.

Yet another aspect of the disclosure relates to a method for determining a relationship for predicting swelling of batteries from a state of health (SOH) of the batteries. The method involves: (a) charging and discharging one or more rechargeable batteries for one or more charge cycles; (b) measuring values of the SOH of the one or more rechargeable batteries; (c) measuring swelling of the one or more rechargeable batteries; (d) repeating (a)-(c) one or more times, thereby obtaining two or more data points corresponding to the SOH and swelling in two or more charge cycles for the one or more rechargeable batteries; (e) determining the relationship for predicting battery swelling from the SOH using the two or more data points; and (f) storing data describing the relationship in a memory. In some implementations, the SOH is representative of degradation of the battery and/or an ability of the battery to hold a charge. In some implementations, measuring values of the SOH involves measuring terminal voltages or values derived therefrom for the one or more rechargeable batteries. In some implementations, the relationship for predicting battery swelling from the SOH includes a mathematical relationship between the SOH and swelling. The mathematical relationship between the SOH and swelling may include a mathematical relationship between the SOH and capacity fade and a mathematical relationship between the capacity fade and swelling.

These and other features of the disclosure will be presented in more detail below with reference to the associated drawings.

BRIEF DESCRIPTION OF THE DRAWINGS

The present disclosures may be implemented in connection with implementations illustrated in the attached drawings. These drawings show different aspects of the present disclosures and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosures.

Moreover, there are many disclosures described and illustrated herein. The present disclosures are neither limited to any single aspect nor implementation thereof, nor to any combinations or permutations of such aspects or implementations. Moreover, each of the aspects of the present disclosures, and/or implementations thereof, may be employed alone or in combination with one or more of the other aspects of the present disclosures and/or implementations thereof. For the sake of brevity, certain permutations and combinations are not discussed or illustrated separately herein. Notably, an implementation described herein as "exemplary" is not to be construed as preferred or advantageous, for example, over other implementations; rather, it is intended reflect or indicate the implementation(s) is/are "example" implementation(s).

FIG. 12C illustrates circuitry external which accesses the memory to store data (for example, one or more predetermined ranges) employed by control circuitry in conjunction with adapting, adjusting and/or controlling one or more characteristics of the charge or current applied to or injected into the battery/cell in accordance with or based on the thickness or change in thickness (or rate of change) of the battery/cell.

Figure 1:
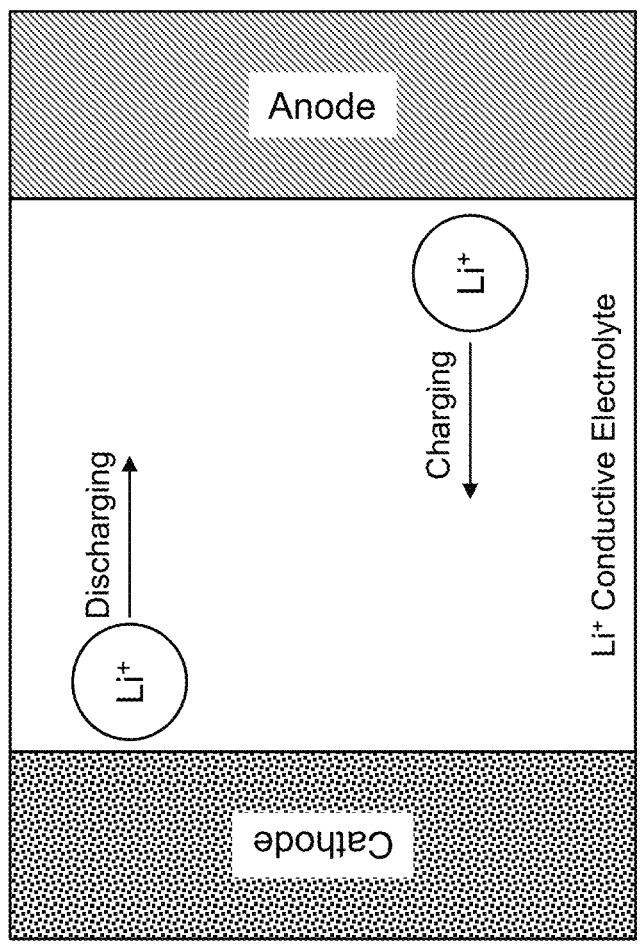
FIG. 1 is a functional illustration of a conventional lithium-ion battery or cell including an anode (negative electrode) and a cathode (positive electrode) and conductive electrolyte (for example, a mixture of carbonates and lithium salt)
Figure 2A:
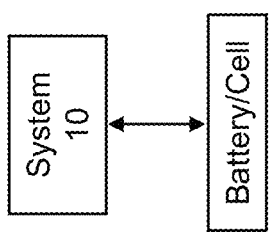
FIGS. 2A and 2B illustrate block diagram representations of exemplary systems for, among other things, estimating changes in thickness or length (i.e., swelling) of a battery/cell (for example, a lithium-ion battery/cell) for example, in situ, during or in use, and/or when undergoing charging or recharging, according to at least certain aspects of certain implementations of the present disclosures, wherein the estimating may be performed in situ, in use, and during charging/recharging, while FIG. 2B includes charging circuitry, control circuitry and monitoring circuitry which may, in addition, be employed to adaptively charge a battery/cell based on or using data that is representative of swelling; notably, although the system is illustrated as including charging circuitry, control circuitry and monitoring circuitry, in one implementation, the system may include only charging circuitry and in another implementation, the system may include charging and control/processing circuitry.
Figure 2B:
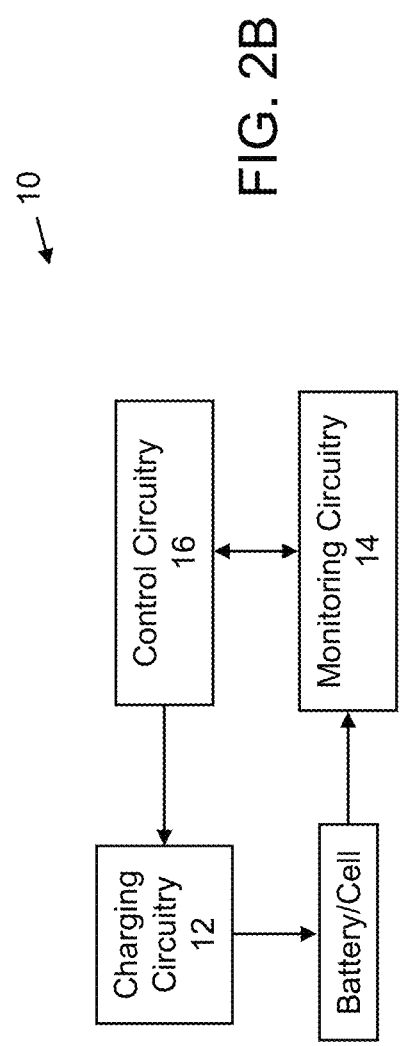

Again, there are many disclosures described and illustrated herein. The present disclosures are neither limited to any single aspect nor implementation thereof, nor to any combinations and/or permutations of such aspects and/or implementations. Each of the aspects of the present disclosures, and/or implementations thereof, may be employed alone or in combination with one or more of the other aspects of the present disclosures and/or implementations

DETAILED DESCRIPTION

The disclosed implementations concern methods, apparatus, and systems for estimating, calculating, measuring and/or determining the thickness or changes in thickness of a battery.

The term "battery" as used herein refers to one or more galvanic cells unless specified otherwise. Although some technical materials describe a battery as including two or more cells, the term "battery" is not so limited in this disclosure. In some implementations, a battery can be a single cell or multiple cells connected together in series or parallel to make the desired voltage or current rating.

A "charge cycle" is the process of charging a rechargeable battery and discharging it with a particular load. In some implementations, a charge cycle means charging and discharging a load equivalent to the battery's capacity, but not necessarily by one full charge and one full discharge. For instance, using half the charge of a fully charged battery, recharging it, and then using the same amount of charge again count as one charge cycle. The number of charge cycles to failure indicates how many times a rechargeable battery can undergo the process of complete charging and discharging until failing certain criteria. The number of charge cycles may be used to specify a battery's expected life, which may affect battery life more than the mere passage of time.

"Measuring" an attribute as stated herein is a way of obtaining a value of the attribute. For instance, measuring the voltage of a battery can mean using an instrument such as a voltmeter to directly measure the voltage between terminals of the battery. In some context, it may also mean obtaining data related to the voltage of the battery (e.g., capacity fade of a battery) and/or deriving other information about the battery (e.g., battery swelling). Typical measurements of a battery may include current, charge passed or coulombs injected into the battery, voltage, size, and temperature.

The term "capacity fade" refers to reduction of battery capacity over time or charge/discharge cycles. It may be based on a maximum of the battery capacity or other reference values of battery capacity (e.g., 85% of initial maximum capacity, capacity at specific terminal voltage, etc.)

State of charge (SOC) may refer to the present battery capacity as a percentage of maximum capacity. SOC may be calculated using current integration to determine the change in battery capacity over time or charge/discharge cycles.

Terminal voltage is the voltage between the battery terminals with load applied. Terminal voltage may vary with SOC and discharge/charge current.

Capacity or nominal capacity in implementations refers to the coulometric capacity, e.g., the total Amp-hours available when the battery is discharged at a certain discharge current (which may be specified as a C-rate) from 100 percent state-of-charge to a defined cut-off voltage.

The term "swelling" refers to an increase in the size, volume, or any dimensions of the battery.

Determining a "relationship" as used herein refers to determining a relationship between one or more input variables and one or more output variables. In some implementations, the relationship includes a mathematical function relating one or more input variables to an output variable. In some implementations, the relationship includes a univariate or a multi-variate model using one or more input variables to predict one or more output variables. In other implementations, the relationship may be implemented as a lookup table containing values for one or more input variables and corresponding values for one or more output variables. The relationship may be simply a correlation between the one or more input variables and one or more output variables.

The state of health (SOH) of a battery (for example, a rechargeable lithium-ion (Li+) battery, is a parameter that describes, characterizes, or is representative of the "age" of the battery and/or ability of the battery to hold charge, for example, relative to a given time in operation (for example, the initial time in operation). The SOH of a battery provides information to estimate, calculate, measure, and/or determine other battery parameters such as the ability of a battery to hold a charge. The voltage at the terminals of the battery changes as the SOH changes—and, hence the voltage curves of the battery shift as it ages and its SOH deteriorates.

Numeric ranges are inclusive of the numbers defining the range. It is intended that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The headings provided herein are not intended to limit the disclosure.

Unless defined otherwise herein, all technical and scientific terms used herein have the same meaning as commonly understood by one of ordinary skill in the art. Various scientific dictionaries that include the terms included herein are well known and available to those in the art. Although any methods and materials similar or equivalent to those described herein find use in the practice or testing of the implementations disclosed herein, some methods and materials are described.

As used herein, the singular terms "a," "an," and "the" include the plural reference unless the context clearly indicates otherwise.

The logical connector "or" as used herein is inclusive unless specified otherwise. As such, condition "A or B" is satisfied by "A and B" unless specified otherwise.

INTRODUCTION

Because battery swelling may functionally or structurally compromise battery-powered devices, it is desirable to monitor and manage battery swelling in various applications. Conventional instrumentation such as mechanical or electronic calipers and indicators can be used to measure dimensions of batteries, but are not suitable for monitoring batteries, e.g., rechargeable batteries, in situ when the batteries are being used, charged, and discharged in consumer electronics and other used scenarios. Some implementations of the current disclosure provide methods and systems for estimating battery swelling in situ when conventional instrumentations and methods are unsuitable. Some of these implementations can estimate swelling from data collected by pre-existing components of the battery-powered devices. Some implementations can measure swelling using sensors disposed proximate to or on the batteries.

In addition to monitoring swelling of batteries, another aspect of the disclosure provides methods and systems for reducing or managing battery swelling, which may improve battery life, safety, form factor, or functions of battery-powered devices. Some implementations achieve these improvements through adaptive charging based on data related to battery swelling.

The present disclosures, in certain aspects, are directed to circuitry and techniques for estimating thickness or changes in thickness (i.e., swelling) of a battery (for example, a lithium-ion battery) for example, in situ, during or in use, and/or when undergoing charging or recharging (hereinafter collectively "charging"). Estimation or estimating is a process of finding an estimate, or approximation, of a quantity or quality of interest, which is useful regardless if input data is incomplete, uncertain, or unstable. In some applications, estimation may involve using the value of a statistic derived from one or more samples (e.g., terminal charge of a number of test batteries) to estimate the value of a corresponding population parameter (e.g., thickness of batteries of the instant kind). In some implementations, "estimating" a quantity comprises operations for measuring, calculating, evaluating, and/or determining the quantity.

In one exemplary implementation, swelling of a battery is estimated based on a value of or derived from a capacity of the battery (for example, the amount of capacity during use, operation and charging or recharging). In some implementations, the value of or derived from capacity may be a change, fade, loss, or reduction of capacity over time in various implementations. In some implementations, the value may be other measures derived from capacity, such as rate of change of capacity, inflection or asymptote of a mathematical function involving capacity or capacity fade. The capacity, or change in capacity of the battery may be estimated using any technique or circuitry now known or later developed. For example, the fade of capacity may be estimated using a state of health (SOH) measure of the battery or using a charge voltage to charge capacity relationship. For example, in the charge voltage to charge capacity relationships shown hereinafter, the charge voltage changes across charging cycles, indicating a higher voltage value for the same amount of charge stored within the battery across charging cycles, the increase of charge voltage indicating a capacity fade of the battery.

In another exemplary implementation, battery swelling is estimated based on a SOH of the battery. Notably, the SOH of a rechargeable battery (for example, a rechargeable lithium-ion battery) is a parameter that describes, characterizes or is representative of the "age" of the battery, the degradation levels of the battery or an ability of the battery to hold charge, for example, relative to a given time in operation (for example, the initial time in operation). The SOH of the battery may be estimated using any technique or circuitry now known or later developed including, for example, the techniques described or illustrated in, for example, U.S. application Ser. No. 13/366,352, U.S. application Ser. No. 13/657,841 and U.S. application Ser. No. 14/003,826—all of which are incorporated herein by reference.

The present disclosures, in other aspects, are directed to circuitry and techniques for adaptively charging a battery based on or using data which is representative of the thickness or change in thickness (or rate of change) of the battery. In one implementation, the adaptive charging techniques or circuitry uses or employs such data, alone or in connection with other considerations, parameters, constraints or requirements, to change, adjust, control or vary the charging current signal(s), including the characteristics thereof. For example, in one exemplary implementation where the battery is charged using pulse current charging techniques (see, e.g., FIGS. 9A-9D and 10A-10P), the circuitry and techniques of the present disclosures may implement, provide, change, adjust or control one or more characteristics of the charging signal applied to the battery (for example, a shape of charge or discharge signal (if any), amplitude thereof, duration thereof, duty cycle thereof, rest period (if any) or sequence of charge or discharge pulses) according to the amount of swelling of the battery. Such techniques may facilitate managing or controlling the thickness or change (or rate thereof) in thickness of the battery.

In addition thereto, or in lieu thereof, such techniques may facilitate meeting or compliance with safety considerations, conditions or "goals" defined by, associated with or corresponding to the battery—for example, limit or control the thickness of the battery (or change therein) to not exceed a given amount (which may depend on the state of charge (SOC) or SOH of the battery). In one implementation, the amount of swell is controlled or limited by adjusting the charging signal (as indicated above) or reducing the maximum SOC or the charge level of the battery as a result of a full or complete charging sequence. For example, the thickness of the battery (or change in thickness of the battery) may be controlled or managed by terminating a charging sequence when a SOC of the battery is less than 100% —for example, terminating the charging sequence when the battery is charged to 90-95% of a previous SOC, battery rating or a SOC of a new battery (for example, the original/initial SOC of that battery (i.e., when that battery was "new")). In this way, the thickness or change in thickness (or rate thereof) of the battery may be managed or controlled to not exceed a predetermined range or value, for example, to reduce potentially adverse impact or consequences of swelling.

In another implementation, the circuitry and techniques of the present disclosures may adaptively charge a battery to a SOC that is defined by a predetermined range or thickness value or change in thickness (or rate thereof) of the battery. In this regard, the circuitry and techniques may correlate capacity retention to an "acceptable" percentage of swelling and based thereon, charge a battery to a SOC that is defined by or associated with such fade or change in, loss or reduction of a capacity of the battery. Here the "acceptable" thickness or change in thickness (or rate thereof) of the battery may be based on a number of factors including meeting or compliance with safety considerations. In this way, circuitry and techniques manage or control the thickness or change in thickness (or rate thereof) of the battery to not exceed a predetermined range or value (for example, to reduce potentially adverse impact or consequences of swelling) by correlating the fade or change in, loss or reduction of a capacity of the battery to a SOC of the battery that maintains the thickness or change in thickness (or rate thereof) of the battery to a predetermined range or value.

Notably, the SOC of a battery, for example, a lithium-ion rechargeable battery, is a parameter that is representative or indicates the level of electrical charge available in the battery. It may be characterized as a percentage of the nominal full charge rating of the battery, wherein a 100% SOC indicates that a battery is fully charged and a 0% SOC indicates that the battery is fully discharged. The SOC of the battery may also be characterized as an available charge stored in the battery relative to a maximum available charge stored in the battery—wherein the maximum available charge may change over time as, for example, the battery ages or deteriorates.

Figure 11A:
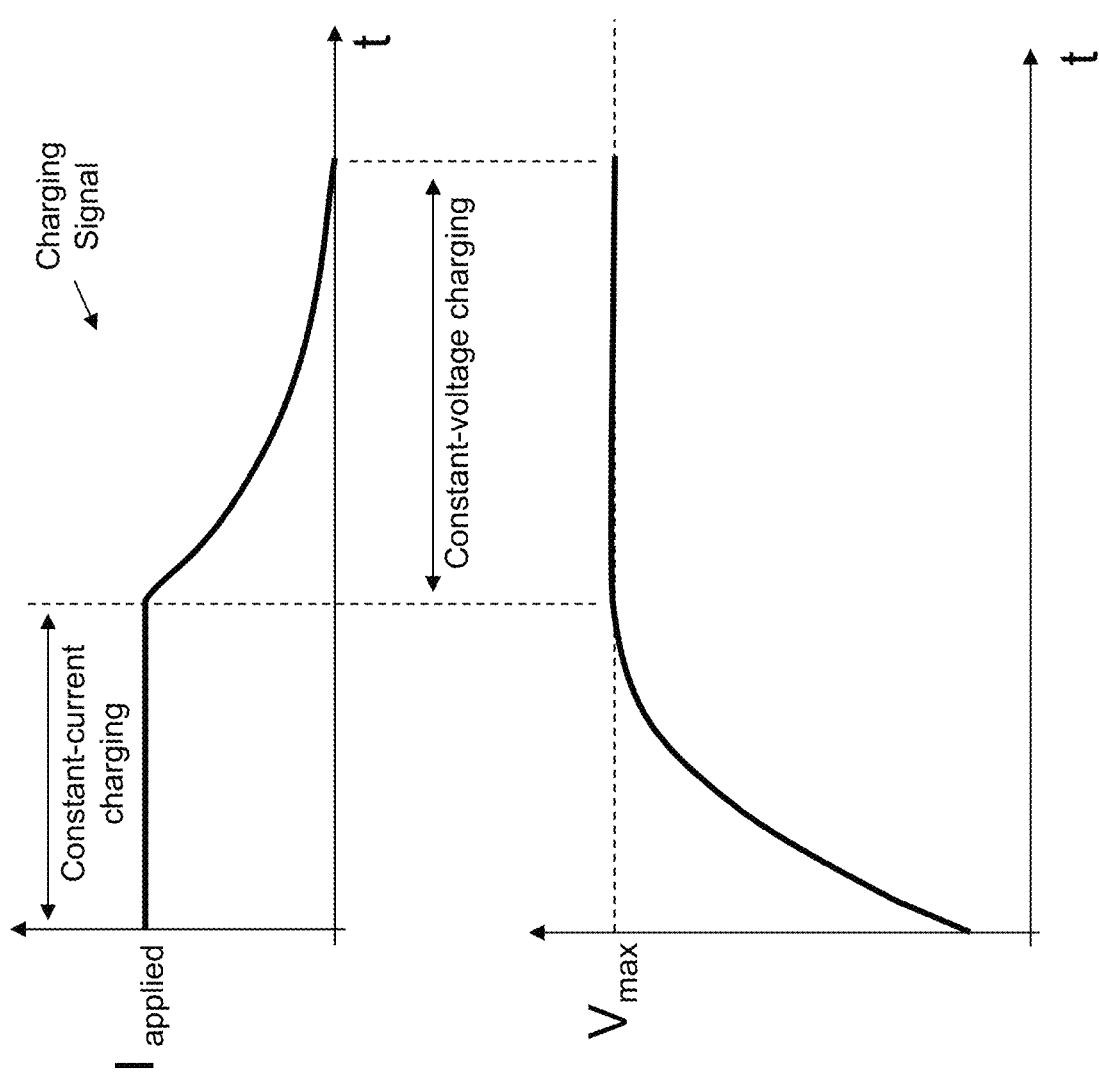
FIG. 11A illustrates current and voltage of a battery/cell as a function of time illustrating the conventional charging method known as constant-current, constant-voltage (CCCV); notably, a conventional method to charge a rechargeable battery, including a lithium-ion type rechargeable battery, employs a CCCV technique, wherein the charging sequence includes a constant-current (CC) charging mode until the terminal voltage of the battery/cell is at about a maximum amplitude (for example, about 4.2V to 4.5V for certain lithium-ion type rechargeable batteries) at which point the charging sequence changes from the constant-current charging mode to a constant-voltage (CV) charging mode, wherein in the CV mode, a constant voltage is applied to the terminals of the battery/cell until a termination current is reached (for example, a current in the range of about 0.02C to 0.05C); in the CCCV technique, the charging circuitry often changes from the CC charging mode to the CV charging mode when the state of charge (SOC) of the battery/cell is at about 50-80%, depending on the applied current (notably, at higher currents, the transition to CV may be less than 50% SOC.
Figure 11B:
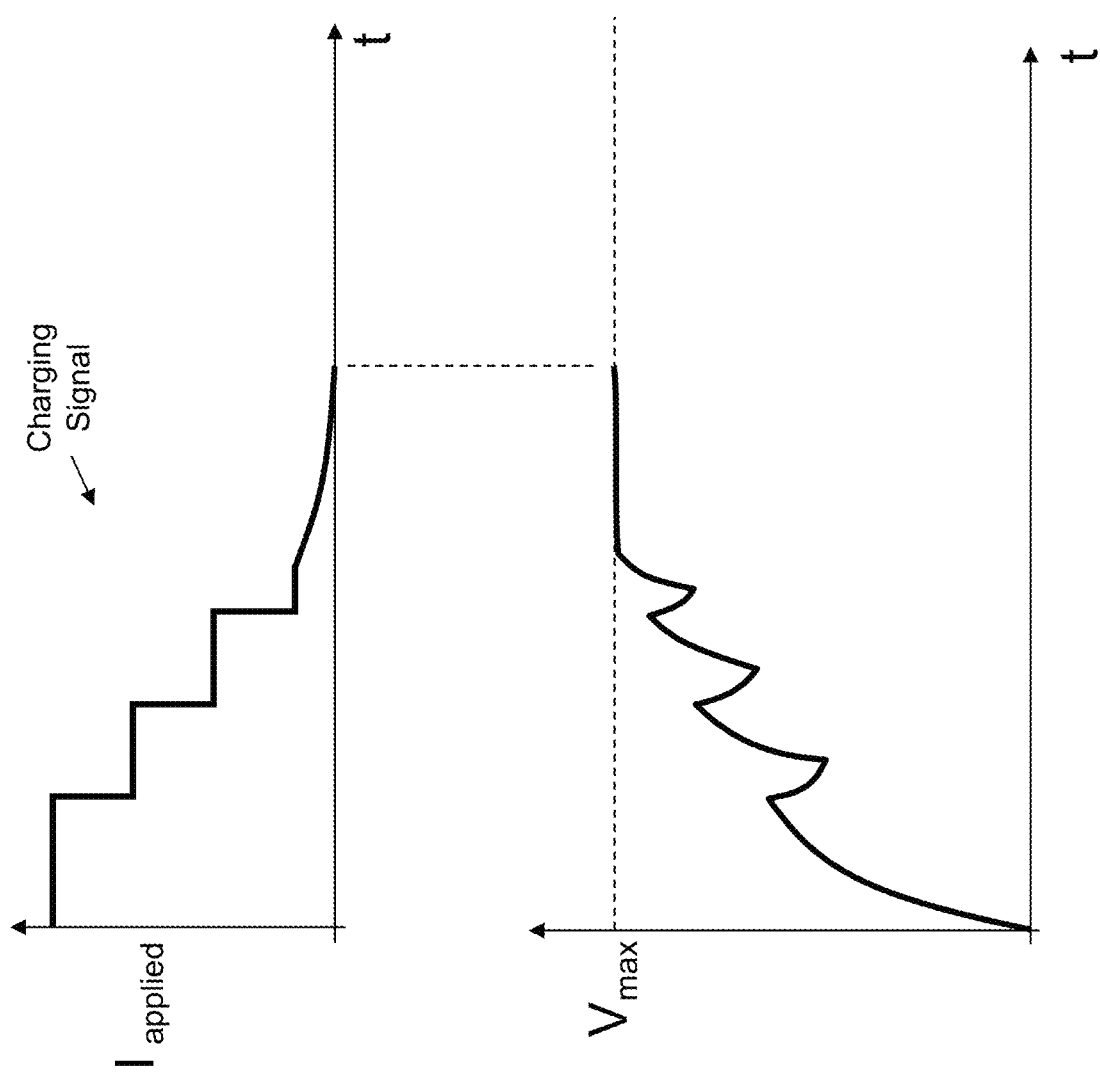
FIG. 11B illustrates current and voltage of a battery/cell as a function of time illustrating a charging method known as step-charging; notably, a method to step-charging a rechargeable battery, including a lithium-ion type rechargeable battery, employs a multiple step charging mode where the current is decreased at different voltages until the lower current reaches a terminal voltage of the battery/cell at about a maximum amplitude (for example, about 4.2V to 4.5V for certain lithium-ion type rechargeable batteries) at which point the charging sequence changes from the constant-current charging mode to a constant-voltage (CV) charging mode, wherein in the CV mode, a constant voltage is applied to the terminals of the battery/cell.

In another exemplary implementation, where the battery is charged using a constant-current, constant-voltage ("CCCV") charging technique or a step charging technique (see, e.g., FIGS. 11A and 11B), the circuitry and techniques of the present disclosures may implement or adapt the charging operation, in accordance with, using or based on the swelling data to implement, determine, change, adjust, control or vary an amplitude of the charging current applied to or voltage of the battery during the charging operation. For example, the number of steps, amplitude of one or more steps, voltage of one or more steps or length of time of one or more steps may be adjusted according to the amount of swelling of the battery. Further, in a CCCV technique, the transition from CC to CV may be adjusted or based on the amount of swelling experienced by the battery during, for example, the charging operation.

As noted above, such techniques may facilitate managing or controlling the amount of swell of the battery or meeting or compliance with safety considerations, conditions or "goals"—for example, limiting, managing or controlling the thickness of the battery (or change therein) to remain below or within (or not exceed) a given limit. Such given limit may depend on the SOC or SOH of the battery. Indeed, in one implementation, the amount of swell is controlled or limited by adjusting the charging signal (as indicated above) or reducing the maximum SOC of the battery as a result of a complete or full charging sequence. For example, the thickness or change in thickness of the battery may be controlled during a charging operation by terminating a charging sequence when a SOC of the battery is less than 100%—for example, at 85% of a previous SOC, rating or a new battery. In this way, a thickness or change in thickness of the battery may be managed so that such thickness does not exceed a given amount during a charging operation.

Briefly, by way of background, with reference to FIG. 1, there are three primary functional components of a lithium-ion battery—including a negative electrode (anode) and a positive electrode (cathode) and electrolyte (for example, a mixture such as mixture of organic carbonates and lithium salt). During the charge and discharge operations, the electrodes of a lithium-ion battery often "breathe" or undergo changes in thickness (expand or contract) as lithium is intercalated in and de-intercalated out of the electrode. Over time, however, as the battery is repeatedly charged and discharged, the overall thickness of the battery tends to increase. Indeed, in a polymer battery, which employs a soft external polymer pouch for packaging versus a battery that uses a metal casing for packaging, the increase becomes more pronounced because a polymer cell/battery is generally unconstrained by such packaging.

Swelling due to lithium intercalation is, for the most part, reversible from cycle to cycle. However, there are additional factors that impact swelling that tend to be irreversible from cycle to cycle (charging-discharging/use-charging . . . )—for example, gas generation, mechanical failure of the electrodes, manufacturing defects and operating conditions (temperature, charge/discharge voltage, charge/discharge current). Irreversible swelling tends to result in a more permanent increase in the thickness of the battery.

A lithium-ion battery typically includes one or more metal oxide cathodes and one or more graphitic anodes. It has been observed that during lithium intercalation cathodes tend to swell approximately 3-4% of their original thickness while anodes swell approximately 7-10% for graphite-based anodes. Alloy-based anodes using silicon or silicon composite can swell up to 300%. The amount of swelling in a battery is typically dependent on when, relative to the charge state of the battery, thickness measurements are made. The battery is often at a maximum thickness when it is fully charged wherein when fully charged, the anode is at its maximum thickness. The battery is often at a minimum thickness when it is fully discharged wherein when fully discharged, the anode is at its minimum thickness.

The swelling or change in thickness of the battery may occur non-uniformly or in a non-uniform pattern across the surface of the battery. As such, the amount of swelling may be a measure of an average increase in thickness across the battery or a maximum increase in thickness across the surface of the battery. Notably, it may be advantageous to measure the swell or the amount of swelling when the cell is not physically or mechanically constrained in order to determine the maximum increase in thickness or highest point or area on the surface of the battery.

Implementations

Estimating Battery Swelling

There are many disclosures described and illustrated herein. In one aspect, the present disclosures are directed to circuitry and techniques for estimating the thickness or changes in thickness (i.e., swelling of the battery) of a battery. Such circuitry and techniques may estimate the thickness or change in thickness of a battery in situ, when the battery is in use, such as when the battery is undergoing charging. In one exemplary implementation, the circuitry and techniques estimate the thickness or change in thickness of a battery based on a fade or change in, loss or reduction of a capacity of the battery over time (for example, the amount of capacity during use, operation and charging or recharging). Here, the circuitry and techniques may determine a fade or change in, loss or reduction of a capacity of the battery and correlate that information to thickness or change in thickness of a battery. Notably, the fade or change in, loss or reduction of a capacity of the battery may be estimated using any technique or circuitry now known or later developed including, for example, based on a state of health (SOH) of the battery or a charge-voltage to charge-capacity relationship (wherein the charge voltage changes indicating a higher voltage value for the same amount of charge stored within the battery which correlates to a capacity fade of the battery).

Figure 3:
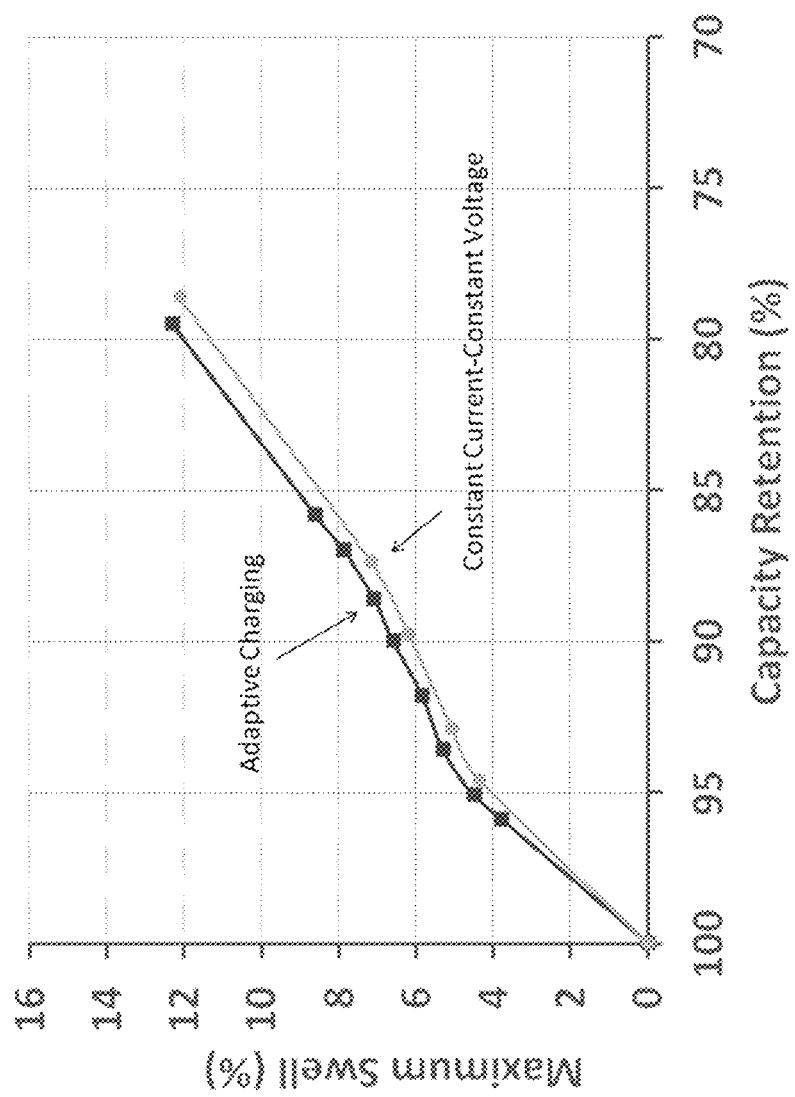
FIG. 3 is a graphical illustration of an exemplary relationship of swelling of the battery/cell as a function of capacity retention (plotted with decreasing retention along the x-axis) according to at least certain aspects of certain implementations of the present disclosures, wherein the swelling of the battery/cell increases as the capacity of the battery/cell decreases over time, use, or charge cycles; notably, the amount of swell may depend on the technique employed to charge or recharge the battery (for example, an adaptive charging technique versus non-adaptive CCCV charging technique), in addition to capacity retention.
Figure 4:
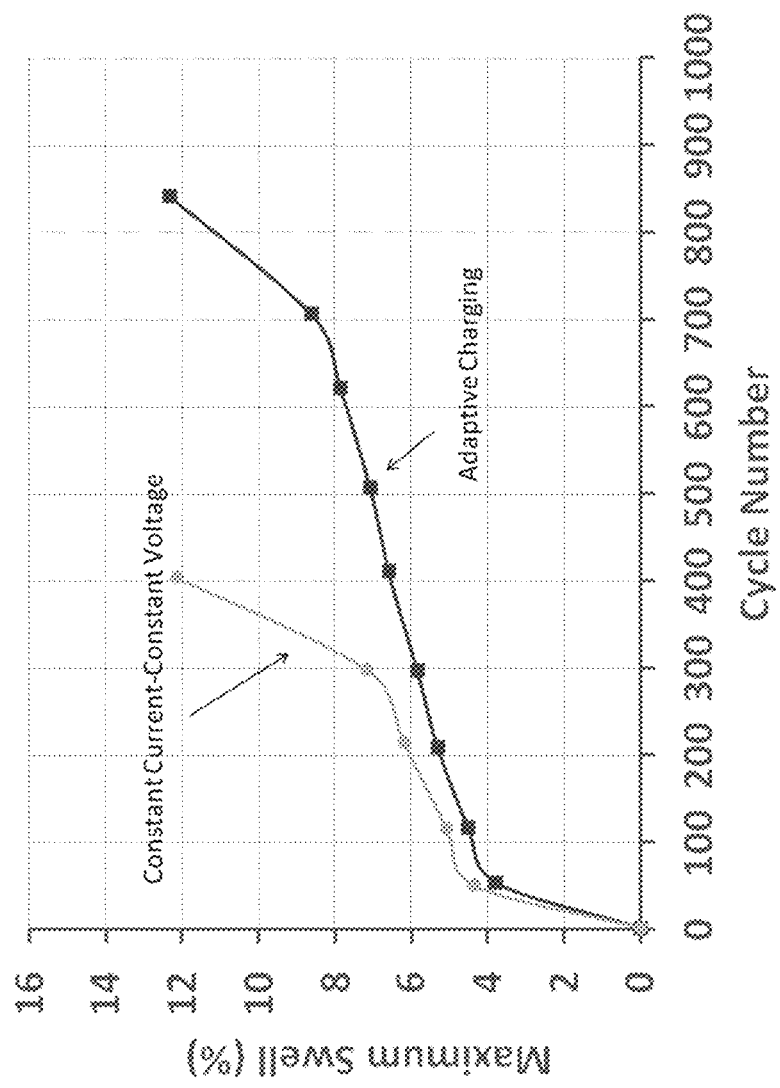
FIG. 4 is a graphical illustration of the maximum swelling of a battery/cell as a function of the number of cycles achieved before the cell's capacity reached 80% of the initial capacity; notably, when implementing an adaptive charging technique, the cycle life of the battery/cell is extended (relative to a CCCV charging technique) by mitigating the degradation mechanisms taking place while the cells were constantly charging and discharging; as evident, the type of charging sequence employed may have an impact on the amount of swelling of the battery/cell as a function of cycle number (FIG. 4), and a relatively minor effect on the amount of swelling as a function of capacity retention (FIG. 3), as indicated by the separation between the curves for conventional CCCV and adaptive charging sequences.

With reference to FIGS. 2A, 2B, 3 and 4, in one implementation, system 10 estimates a fade or a change in or loss or reduction of a capacity of the battery over time (for example, the amount of capacity during use, operation and charging or recharging). Using that information, system 10 may estimate a thickness or change in thickness of the battery. See, for example, FIGS. 3 and 4. FIG. 3 shows an illustration of an exemplary relationship of the thickness of the battery/cell as a function of capacity (or lost capacity). Here, the battery/cell thickness increases as a function of capacity fade, or capacity retention plotted in reverse order. In other words, there is an increase in thickness in relation to an amount of capacity lost via use or over time. FIG. 4 shows an illustration of an exemplary relationship of the maximum thickness of a cell as a function of the number of cycles achieved before the cell's capacity reached 80% of the initial capacity. Notably, adaptive charging extended the cycle life of the cells by mitigating the degradation mechanisms taking place while the cells were constantly charging and discharging. Notably, the thickness or swell measurements were made using a static measurement technique. Measurements were made in 100 cycle intervals until the cell reached 80% of initial capacity. Here, system 10 correlates the swell of the battery to the percentage of capacity retention.

Notably, the relationship between the swell of the battery and the fade or reduction of capacity of the battery may be estimated using any technique now known or later developed—all of which are intended to fall within the scope of the present disclosures. In various applications, there is a high correlation between swelling and reduction of capacity. In one implementation, the relationship or correlation is determined using empirical data, test data, characterization/simulation data, theoretical data or a mathematical relationship. For example, determining a relationship between a change in terminal voltage (over charge-discharge cycling) and the capacity retention (while also measuring, detecting or determining a swell of the battery) may be employed to correlate a swell of the battery to the capacity retention.

Such relationship may be developed, acquired or determined using static or dynamic configurations or techniques wherein acquired empirical data is collected when the battery is connected to a test platform, in situ, when the battery is in use, and/or when the battery is undergoing charging. All such environments or techniques are intended to fall within the scope of the present disclosures.

In one implementation, one or more related batteries are characterized by cycling (charging/discharging in conjunction with acquisition of swelling measurements) the one or more related batteries to correlate capacity fade of each battery with a thickness or change in thickness of the battery. The empirical correlation data may then be manipulated (for example, averaged) to provide a correlation of capacity retention to the swell for like, similar or related batteries (for example, a certain related series, manufacturing lot, chemistry, architecture and/or design). For example, in one exemplary implementation, the data or tables are generated to correlate the changes in terminal voltage with the SOH of the battery as well as the thickness or changes in thickness of the battery. Different charging sequences or parameters may be used for different batteries to create more complete correlation relationships between changes in terminal voltage values, capacity fade and thickness or changes in thickness of the batteries. Notably, the changes in terminal voltage values, capacity fade and thickness of the battery may also be correlated using physical models related to the transport of lithium-ions within the battery.

The aforementioned correlation or relationships may be stored in memory (for example, in a database or look-up table) during manufacture, test or calibration and accessible to the circuitry or processes of the present disclosures during operation (for example, via access of the memory). The memory may be integrated or embedded in other circuitry (for example, control or processing circuitry associated with the battery) or discrete. The memory may be of any kind or type (for example, EEPROM, Flash, DRAM or SRAM).

Further, the memory may be a permanent, semi-permanent or temporary (i.e., until re-programmed) storage. As such, in one implementation, the memory may be one time programmable, or data, equations, relationships, and/or look-up table employed by the control/processing circuitry may be one time programmable (for example, programmed during test or at manufacture). In another implementation, the memory is more than one time programmable and, as such, the predetermined ranges or values employed by the control circuitry may be modified after test and/or manufacture.

In operation, in one implementation, processing circuitry accesses the capacity fade or conversely the capacity retention to swell relationship, for example, as a mathematical function or values in a look-up table. The processing circuit can use a measurement related to the capacity retention of a battery and the capacity retention to swell relationship to estimate the thickness or change in thickness of the battery.

The data corresponding to the swell of the battery, in relation to capacity fade of the battery, may be acquired using any technique now known or later developed. For example, the swell data may be acquired using a static environment or configuration (whereby the battery is electrically disconnected from the charging circuitry) or a dynamic environment or configuration (whereby the battery is electrically connected to the charging circuitry—and the battery may be undergoing charging or discharging). In both instances, data is acquired to develop a relationship between or the correlation of the swell of the battery to the fade of a capacity of the battery over time. In one implementation, the empirical data (which may consist of data from one or more batteries) provides for a relationship or correlation for related series of batteries, related manufacturing lots of such batteries, or related chemistries, architectures or designs of such batteries. Notably, the empirical data may be employed in generating a mathematical relationship which is representative of the correlation of the swell of the battery to the fade of a capacity of the battery.

In one particular exemplary implementation of a static environment or configuration employed to measure, determine or detect swelling, the battery, upon termination of charging cycle(s), is electrically disconnected from charging circuitry and thickness or swell related data is acquired. Here, the battery is electrically disconnected from charging circuitry to control, manage or reduce measurement error(s) from relaxation of battery thickness when the battery is at "rest" or stable. (See, for example, FIG. 5). In one exemplary implementation, thickness measurements are acquired within minutes (for example, within less than ten minutes) of electrically disconnecting the battery from the charging circuitry—for example, using a thickness gauge instrument/tool (such as, Mitutoyo Digimatic Indicator).

Figure 5:
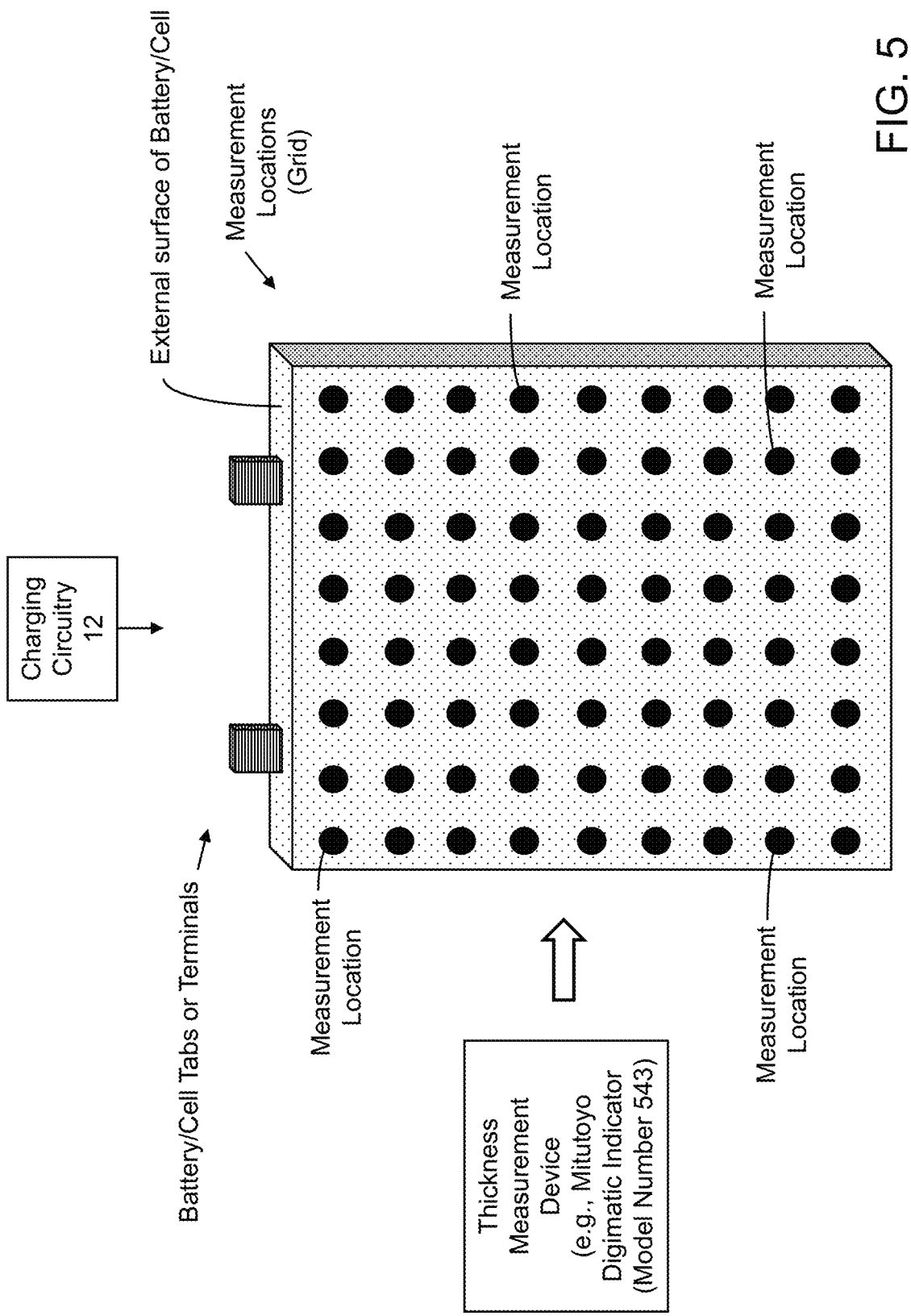
FIG. 5 is an exemplary block diagram representation of a configuration to measure, determine and/or detect swelling according to at least certain aspects of certain implementations of the present disclosures, wherein the cell thickness is measured using a thickness gauge measurement device (for example, Mitutoyo Digimatic Indicator (Model Number 543)); in one exemplary implementation, the thickness gauge measurement device may be mounted on an SPI comparator with a given resolution (for example, one micron) and exerts a measuring force of less than 1.5N; notably, features in FIG. 5 are not drawn to scale: the dimensions of some features may be exaggerated relative to other elements to improve understanding of the exemplary implementations; for example, one of ordinary skill in the art appreciates that the measurement locations are not drawn to scale and should not be viewed as representing proportional relationships relative to the external surface of the battery/cell.

With specific reference to FIG. 5, in one exemplary implementation, an array of measurements may be taken on a grid of points (for example, fixed points with a particular spacing (for example, 5 mm spacing) on the external surface of the battery; notably, the configuration/arrangement of measurement points as an array is exemplary, any configuration/arrangement may be employed). It may be advantageous to define the measurement locations in order to ensure that cell thickness measurements are made consistently at the same points along the surface. In this implementation, thickness measurements at each measurement location are recorded in a specified order (for example, each row from left to right starting with the row closest to one of the electrode tabs). In one implementation, the point on the external surface of the battery representing the maximum thickness may be used to calculate swelling—for example, as a percentage of original thickness at the present cycle relative to the very first cycle. The location of the maximum thickness of the cell may vary from cycle to cycle since swelling may exhibit a non-uniform pattern in which case, the measurement location of maximum swelling may change. The array of measurements may be employed, via control and processing circuitry, to construct surface plots of the cell which track the evolution in cell thickness with cycling and pinpoint areas of the cell where the largest amount of swelling takes place.

It should be noted that the aforementioned implementations may be implemented in a dynamic environment or configuration whereby thickness or swelling data is obtained while the battery is or remains electrically connected to the charging circuitry and, in one implementation, during charging and/or discharging cycles. Such thickness or swelling measurements are preferably made without any weight(s) disposed on the battery in order to identify the thickest points of the external surface of the battery.

Figure 6B:
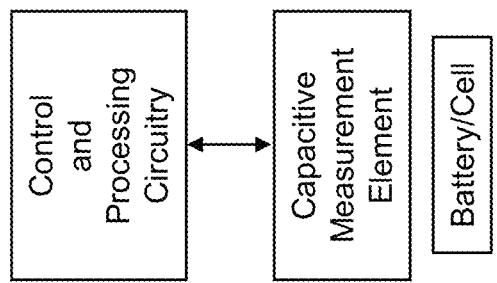
FIGS. 6A and 6B are exemplary block diagram representations of non-contact configurations to measure, determine and/or detect swelling according to at least certain aspects of certain implementations of the present disclosures, wherein the cell thickness is measured using inductive sensing (FIG. 6A) or capacitive sensing (FIG. 6B)
Figure 6A:
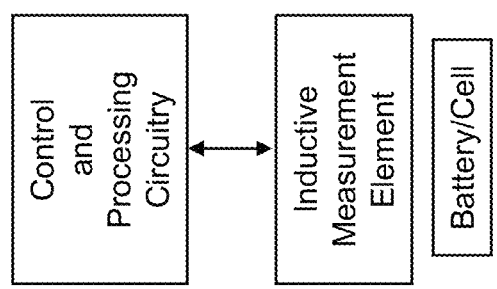

The present disclosures may employ non-contact techniques or configurations to measure, determine or detect swelling. Here, the non-contact techniques or configurations (for example, inductive or capacitive sensing) are employed to acquire data corresponding to the swell of the battery, in relation to fade or a change in or loss or reduction of a capacity of the battery. (See, for example, FIGS. 6A and 6B). The non-contact techniques or configurations may be implemented in a static or dynamic environment. For example, in one implementation, one or more inductive or capacitive sensors is/are disposed or located proximate to or on an external surface of the battery to measure swelling related data, for example, in real-time as the battery undergoes charging or discharging (i.e., is cycled). (See, for example, FIGS. 6C and 6D wherein a plurality of coils or plates is located or disposed in or on a surface (for example, planar or parallel surface) that is proximate and opposing to the surface of the battery (see FIG. 6C wherein the surface of the substrate in which the inductive/capacitive sensors are disposed is located a distance "D" from the external surface of the battery) or is integrated in or on the surface of the battery (see FIG. 6D) when, for example, the external surface of the battery is non-metallic).

Figure 6C:
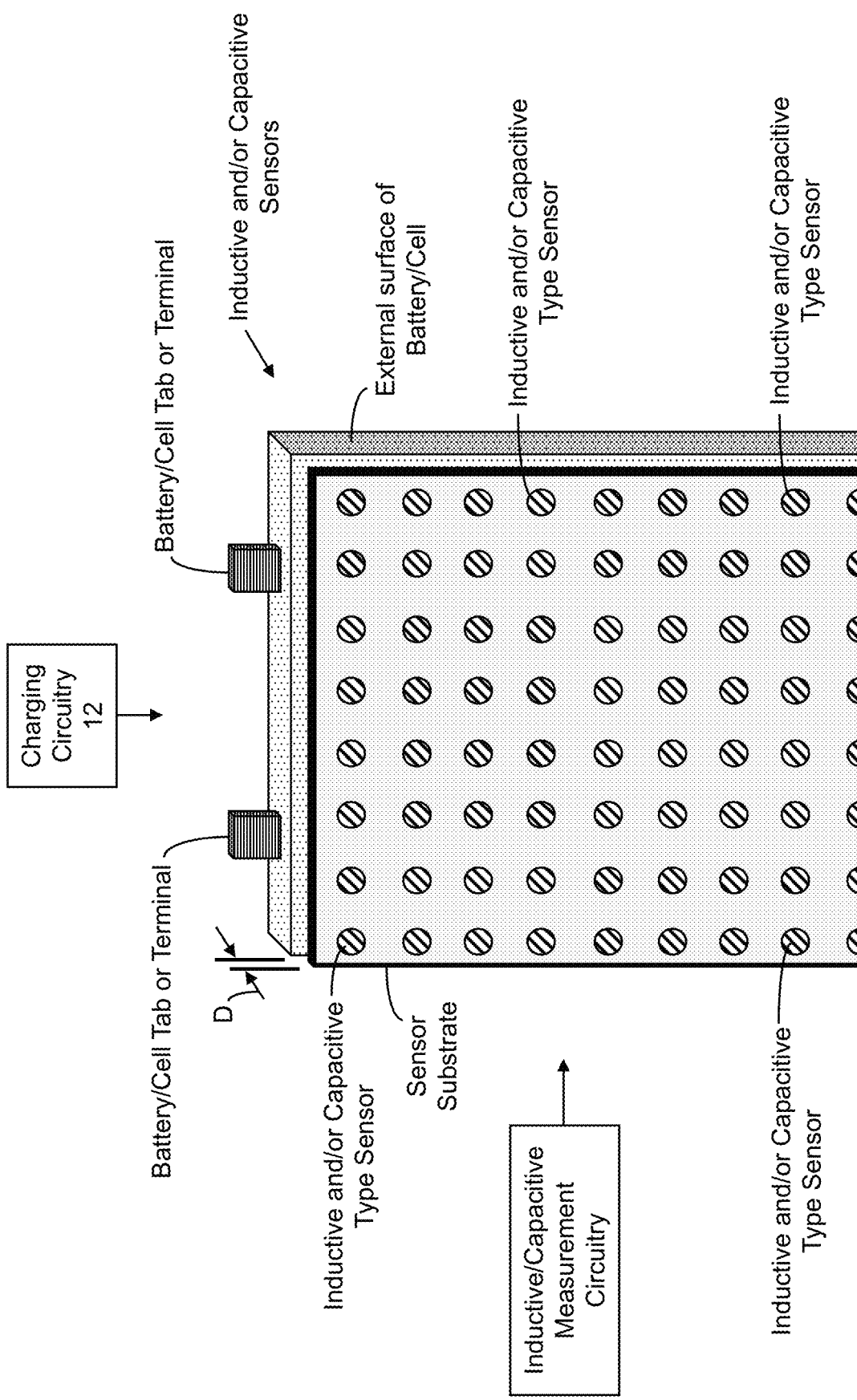
FIGS. 6C and 6D are exemplary block diagram representations of non-contact configurations to measure, determine and/or detect swelling according to at least certain aspects of certain implementations of the present disclosures, wherein the cell thickness is measured using an inductive and/or capacitive sensing technique to detect a thickness or change in thickness (or rate of change) of the battery/cell wherein the inductive and/or capacitive sensors are disposed or located proximate to an external surface of the battery/cell (FIG. 6C), or in or on an external surface of the battery/cell (FIG. 6D) when, for example, the external surface of the battery/cell is non-metallic; electronic circuitry measures the change in inductive/capacitive coupling between one or more sensors and the surface of the battery/cell to measure the displacement of the surface (and consequently, swelling of the battery); the sensors may be implemented as coils or plates, and they may be configured to have a planar form in some implementations; notably, similar to FIG. 5, features in FIGS. 6C and 6D are not drawn to scale: the dimensions of some features may be exaggerated relative to other elements to improve understanding of the exemplary implementations; for example, one of ordinary skill in the art appreciates that the measurement locations are not drawn to scale and should not be viewed as representing proportional relationships relative to the external surface of the battery/cell.
Figure 6D:
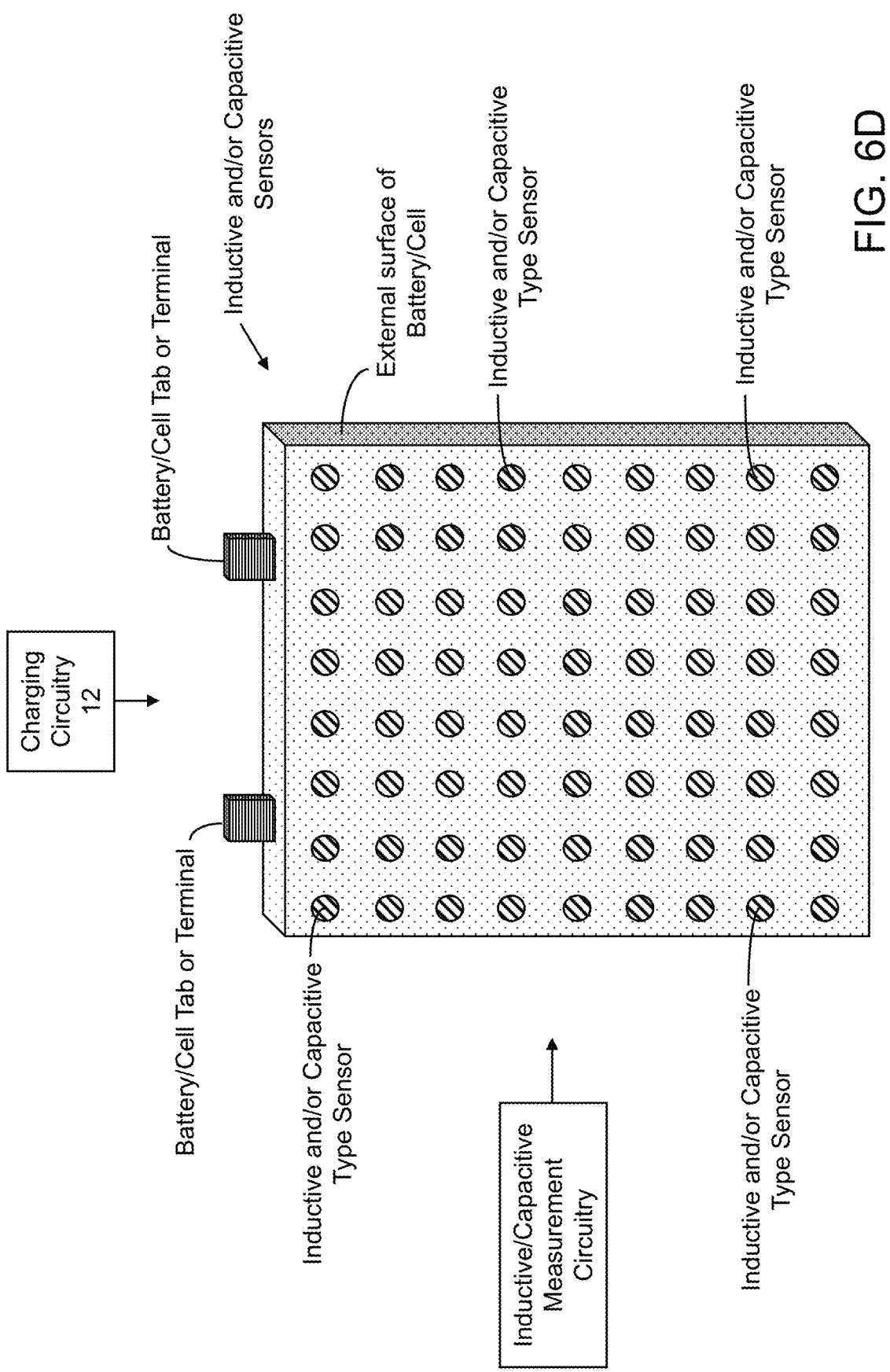

With continued reference to FIG. 6C, the coils or plates are configured relative to the surface of the battery to acquire data which is representative of the thickness or change in thickness (or rate of change) of the battery; notably, the coil/plate array configuration illustrated in FIGS. 6C and 6D is exemplary, any inductive coil or capacitive plate arrangement may be employed (including, in one implementation, both coil(s) and plate(s)). In one implementation, electronic circuitry measures the change in inductive/capacitive coupling between one or more coils/plates and the surface of the battery to measure the displacement of the surface of the battery (and consequently, swelling). Notably, although a plurality of coils/plates are illustrated and described, the present disclosures may be implemented using one inductive coil or capacitive plate.

The non-contact (inductive or capacitive) thickness measurements may be intermittently, periodically or continuously acquired (for example, periodically in the range of seconds (for example, between 1 to 30 seconds—for example, at 16 second intervals). This measurement technique may provide finer level of granularity (relative to the contact techniques/configurations); indeed, such techniques/configurations facilitate or allow acquisition of data corresponding to battery thickness or changes in the thickness during charge or discharge cycles or operations. Notably, the non-contact techniques or configurations may be implemented in battery test platforms as well as when the battery is incorporated into the actual electronic device/product (i.e., the device in which the battery is mounted in and is intended to power).

In one particular implementation, in the context of inductive sensing, a current carrying coil in proximity to a metal surface will induce eddy currents that in turn generate a magnetic field that opposes the original field of the coil. The size of the field generated is a function of the target surface distance and the target composition. If the coil is incorporated as part of a resonator, with the addition of a parallel capacitor, then it can be shown that the power supplied is the sum of the eddy current and inductor losses. Measurements of the equivalent parallel impedance and the oscillation frequency and thereby inductance of the resonant circuit can be made and the inductance L calculated as $L=1/[C*(2\pi f)^2]$. (See, for example, FIG. 6A).

Notably, with reference to FIG. 6C, in those instances where the external surface of the battery includes or consists of a polymer or like material/coating thereon (for example, a material/coating that adversely impacts inductive/capacitive sensing), it may be advantageous to include a target material (for example, copper film/foil such as approximately 20-40 micron copper pliable film/foil) on the external surface of the battery which opposes the sensor substrate. Such a configuration may improve the accuracy of the displacement measurements (and consequently, swelling measurements).

In one exemplary implementation, the swelling measurement system may employ a inductive measurement circuitry (for example, Texas Instruments LDC 1000 inductance-to-digital converter device), an array of analog multiplexer chips and an array of printed circuit board coils to determine the relative distance between the sensing coil and the battery. A control circuitry (for example, a microcontroller) may implement one or more of the following operations: (a) obtain the digital proximity data from the inductive chip; (b) apply averaging, min, max, functions to the data; (c) apply corrections based on temperatures or other factors; (d) convert relative proximity data to absolute proximity data using a look-up-table; (e) manage which coils are being used by controlling the multiplexers; (f) implement the user interface or (g) transmit the data to the data collection system.

Further, in one exemplary implementation of a test platform, an inductive sensor coil and supporting circuitry are connected to a communication port (for example, a USB hub) that in turn is attached to a circuit board. The coil is suspended in a fixed plane above the circuit board, allowing for insertion of a battery between the coil and board. A calibration curve and associated formula allow the conversion of inductance to equivalent thickness. The target battery may be inserted into the measurement cavity between the coil and board and connected to a battery cycling board. The battery cycling board stores and executes a charging and discharging protocol specific to the battery cell. The inductive sensor concurrently measures inductance and effective parallel impedance at a set frequency and stores this information in a separate data file (which may also include a time stamp).

In another exemplary implementation, the thickness or change in thickness of a battery is estimated based on a SOH of the battery. As noted above, the SOH of a rechargeable battery (for example, a rechargeable lithium-ion battery) is a parameter that describes, characterizes or is representative of the "age" of the battery, the degradation levels of the battery or an ability of the battery to hold charge, for example, relative to a given time in operation (for example, the initial time in operation).

Figure 7:
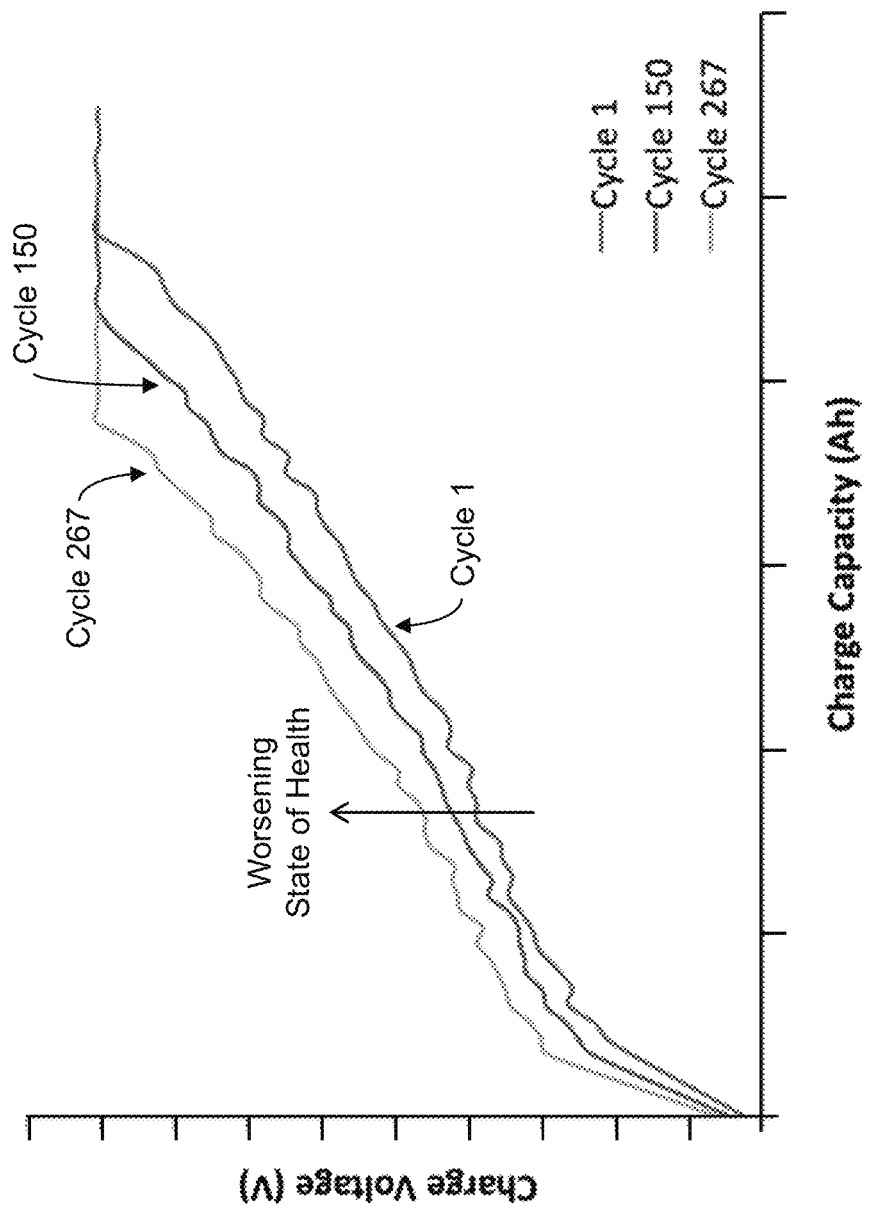
FIG. 7 plots a voltage-charge curve of a lithium-ion battery/cell as the battery/cell ages, deteriorates and/or degrades; here, the voltage-charge curve shifts leftward as charge cycle increases, showing degrading SOH of the battery indicated by increasing charge voltages required to achieve the same charge capacity when charge cycle increases.

With reference to FIGS. 2A, 2B, 3 and 4, in one implementation, system 10 estimates a SOH of the battery and, using that information, system 10 may estimate a thickness or change in thickness of the battery. In this implementation, system 10 correlates the swell of the battery to the SOH of the battery. Thus, in operation, processing circuitry accesses a SOH to swell correlation/relationship, for example, as data in a look-up table or as a mathematical relationship, to estimate the thickness or change in thickness of the battery based on or using a SOH of the battery. As noted above, the SOH of the battery deteriorates as the battery "ages" (for example, undergoes cycling). (See, for example, FIG. 7).

The relationship between or the correlation of the swell of the battery to the SOH of the battery may be estimated using any technique now known or later developed—all of which are intended to fall within the scope of the present disclosures. In addition, such relationship or correlation may employ the same or similar techniques and circuitry described above in connection with determining or developing a relationship or correlation between thickness or change in thickness of the battery to the capacity retention of the battery. For example, in one implementation, the relationship or correlation of the swell of the battery to the SOH of the battery is determined using empirical data, test data, characterization/simulation data, theoretical data or a mathematical relationship. For example, determining a relationship between a change in terminal voltage (over charge-discharge/use cycling) to the SOH of the battery (while measuring, detecting or determining a swell of the battery) may be employed to correlate a swell of the battery to the capacity retention. In one implementation, one or more related batteries are characterized by cycling (charging/discharging in conjunction with acquisition of swelling measurements) such batteries to correlate SOH of each battery with a thickness or change in thickness of the battery. The empirical correlation data may then be manipulated (for example, averaged) to provide a correlation of capacity retention to the swell for like, similar or related batteries (for example, a certain related series, manufacturing lot, chemistry, architecture and/or design).

In another implementation, various charging techniques are used to cycle batteries, and correlation data or tables are generated to correlate the changes in terminal voltage with the capacity fade of the cells/batteries as well as the thickness or changes in thickness of the batteries. Different charging techniques may be used on different batteries to create more extensive correlation or relationship between changes in terminal voltage values, SOH and thickness or changes in thickness of the batteries. Notably, the changes in terminal voltage values, SOH and thickness of the battery may also be correlated using physical models related to the transport of lithium-ions within the battery.

Like that described above, the correlation or relationships may be stored in memory (for example, in a database or look-up table) during manufacture, test or calibration, and accessible to the circuitry or processes of the present disclosures during operation. The memory may be integrated or embedded in other circuitry (for example, control or processing circuitry associated with the battery) or discrete. The memory may be of any kind or type (for example, EEPROM, Flash or SRAM).

In operation, in one implementation, processing circuitry accesses the SOH to battery thickness/swell relationship or correlation, for example, as data in a look-up table or as a mathematical relationship in order to estimate the thickness or change in thickness of the battery based on or using a SOH of the battery.

The data corresponding to the swell of the battery, in relation to SOH of the battery may be same or similar techniques and circuitry described above in connection with determining or developing a relationship of or correlation between thickness or change in thickness of the battery to the capacity retention of the battery. For example, the swell data may be acquired using a static environment or configuration (whereby the battery is electrically disconnected from the charging circuitry) or a dynamic environment or configuration (whereby the battery is electrically connected to the charging circuitry—and the battery may be undergoing charging or discharging). In both instances, data is acquired to develop a relationship between or the correlation of the swell of the battery to the SOH of the battery. In one implementation, the empirical data (which may consist of data from one or more batteries) provides for a relationship or correlation for related series of batteries, related manufacturing lots of such batteries, or related chemistries, architectures or designs of such batteries. Notably, the empirical data may be employed in generating a mathematical relationship which is representative of the correlation of the swell of the battery to the fade or a change in or loss or reduction of a capacity of the battery. As noted above, any technique to measure thickness or change in thickness of the battery, whether now known or later developed, is intended to fall within the scope of the present disclosures.

Managing Battery Swelling

Figure 8A:
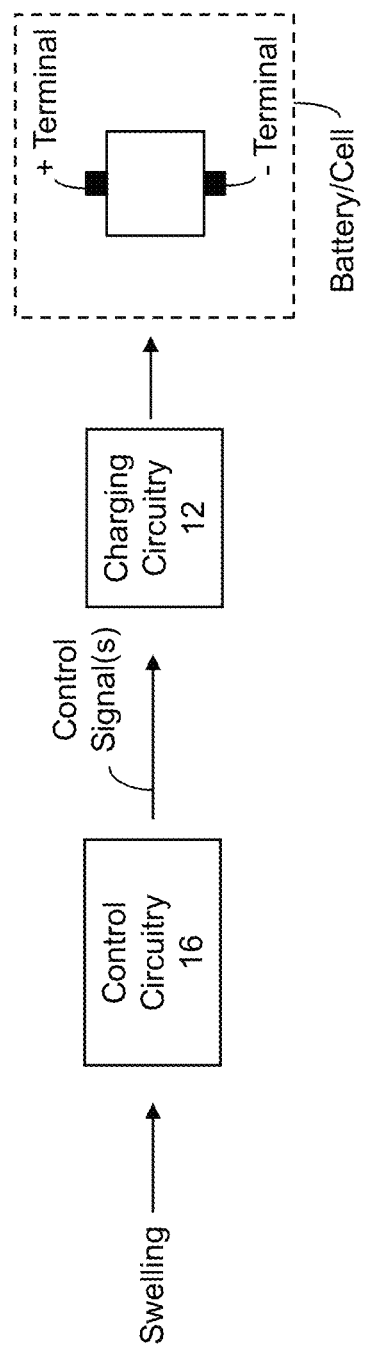
FIGS. 8A-8C illustrate exemplary block diagram representations of exemplary adaptive charging circuitry in conjunction with a battery/cell, according to at least certain aspects of certain implementations of the present disclosures, wherein the control circuitry may employ swelling-related data (alone or in conjunction with one or more other considerations, parameters, constraints and/or requirements) to change, adjust, control and/or vary the charging current signal(s), including the characteristics thereof; notably, the control circuitry may also receive current, voltage and temperature data (for example, feedback data) from the monitoring circuitry (not illustrated) and, in response thereto, evaluate, analyze and/or determine the conditions of the battery and/or charging circuitry during the charge sequence, cycle or operation of the battery/cell.
Figure 8B:
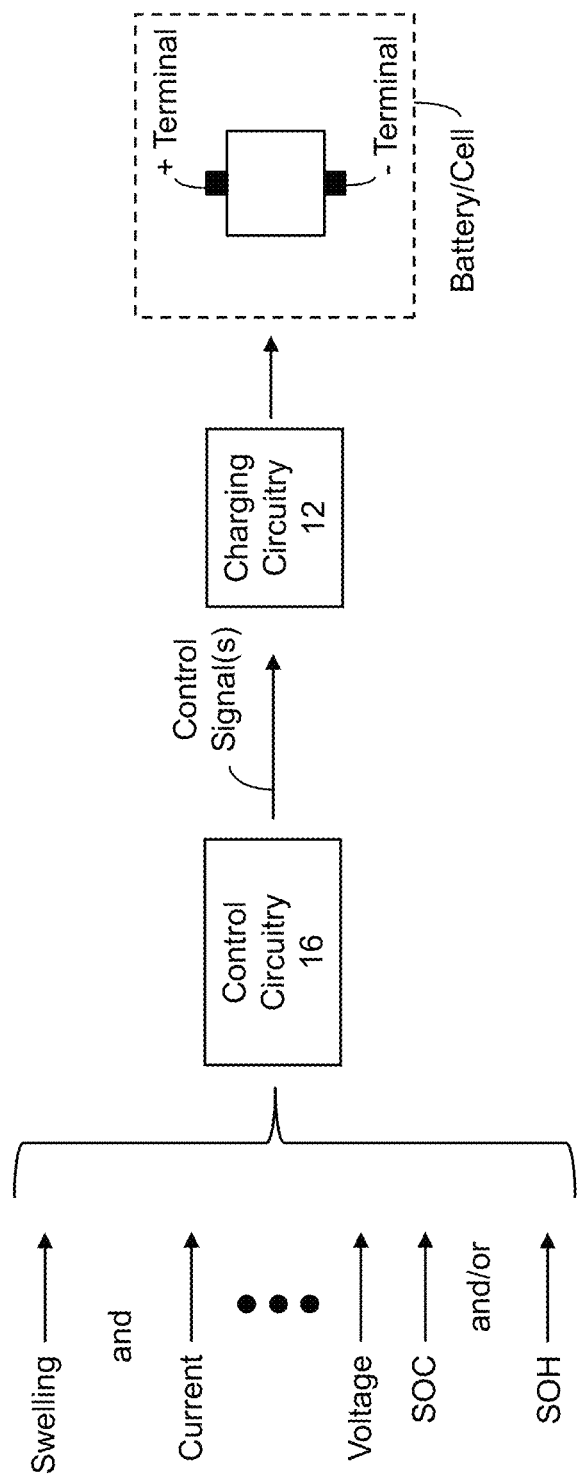
Figure 8C:
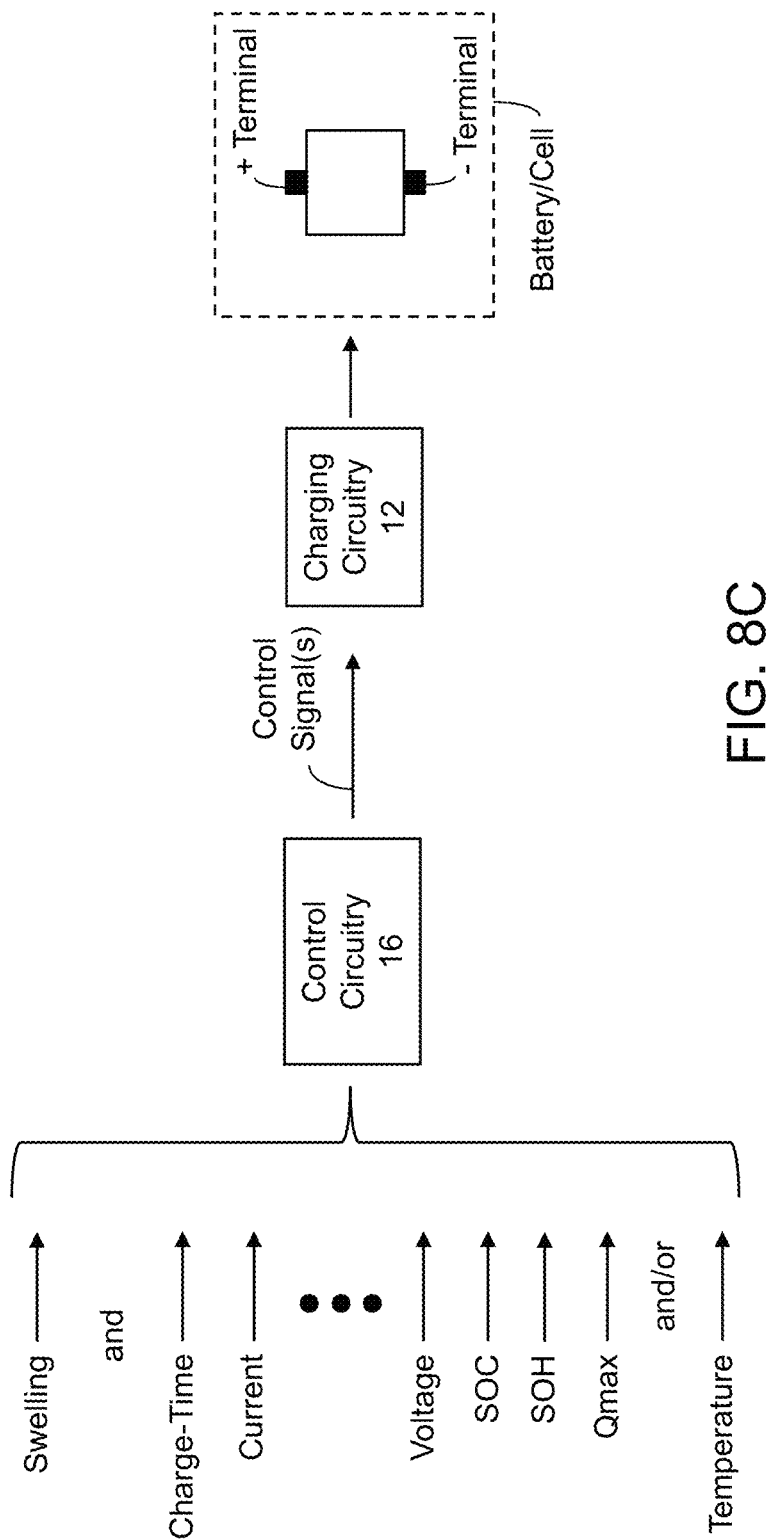
Figure 9A:
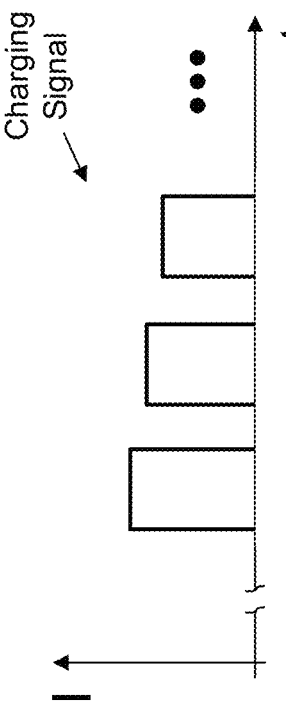
FIGS. 9A-9D illustrate exemplary waveforms illustrating a plurality of exemplary charging signals and discharging signals of an exemplary charging technique, wherein such charging signals may generally decrease according to a predetermined rate and/or pattern (for example, asymptotically, linearly or non-linearly (for example, quadratically)) as the terminal voltage of the battery/cell increases during a charging or recharging sequence, operation or cycle (see, FIGS. 9B and 9D); notably, a charging sequence, operation or cycle may include charging signals (which, in total, inject or apply charge into the battery/cell) and discharging signals (which, in total, remove charge from the battery/cell); moreover, a pulse charging sequence or operation may include a constant voltage (CV) phase after a period of pulse charging and/or upon charging the battery/cell to a predetermined state of charge.
Figure 9B:
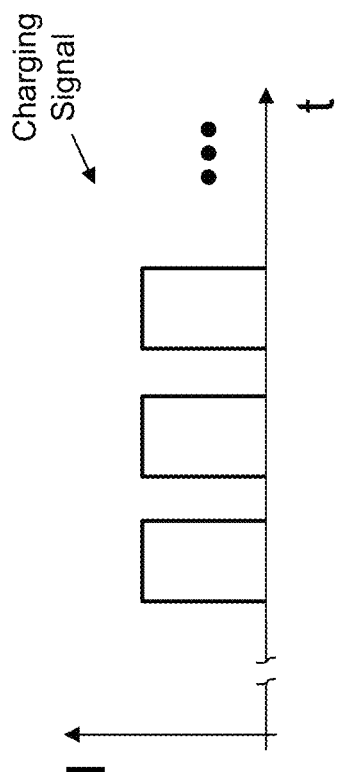
Figure 9C:
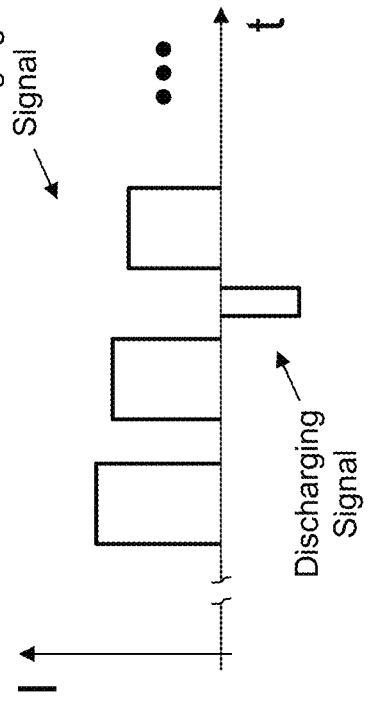
Figure 9D:
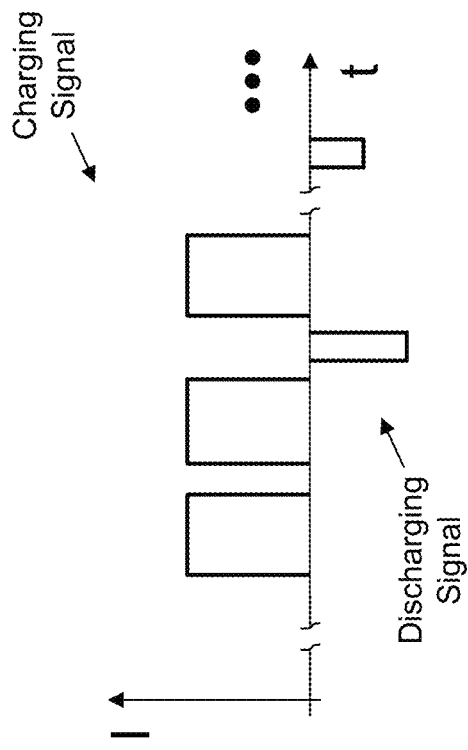
Figure 10L:
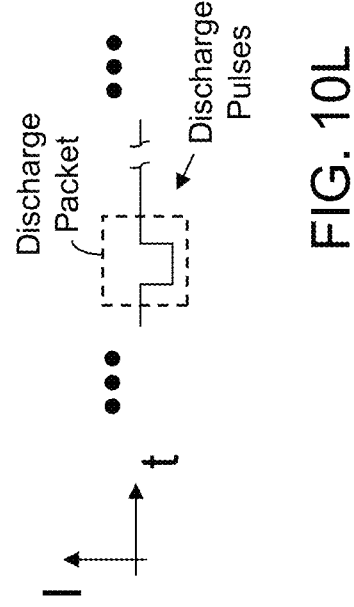
FIGS. 10A-10N illustrate exemplary charge and/or discharge packets of the charging and discharging signals (which are exemplary illustrated in FIGS. 10A-10D), wherein such charge and discharge packets may include one or more charge pulses and one or more discharge pulses; notably, in one implementation, each charge signal of FIGS. 9A-9D may include a plurality of packets (for example, about 100 to about 50,000 packets) and, in one implementation, each packet may include a plurality of charge pulses, discharge pulses and rest periods; notably, the pulses may be any shape (for example, rectangular, triangle, sinusoidal or square); in one exemplary implementation, the charge and/or discharge pulses of the packet may include a temporal duration of between about 1 ms to about 2000 ms, and preferably less than 1000 ms; moreover, as discussed in detail below, one, some or all of the characteristics of the charge and discharge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combinations or permutations of pulse, pulse characteristics, periods, packets and signal characteristics and configurations are intended to fall within the scope of the present disclosures; notably, such one or more charge pulses and/or one or more discharge pulses (including, for example, pulses of charge and/or discharge packets) may be generated via the controllable switch(es) of the charging circuitry.
FIG. 10O illustrates an exemplary charge packet having a charge pulse including a charging period (Tcharge) followed by a rest period (Trest) wherein the period of the charge packet is identified as Tpacket, according to certain aspects of the present disclosures.
FIG. 10P illustrates an exemplary charge packet having a charge pulse (which injects charge into the battery/cell) and a discharge pulse (which removes charge from the battery/cell) wherein the charge pulse includes a charging period (Tcharge) and the discharge pulse includes a discharging period (Tdischarge), according to certain aspects of the present disclosures; notably, in this exemplary charge packet, an intermediate rest period (Tinter) is disposed between the charge and discharge pulses, and a rest period (Trest) is disposed after the discharge pulse and before the next packet; notably, one, some or all of the characteristics of the charge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combination or permutations of pulse, pulse characteristics, periods, packets and signal characteristics and configurations are intended to fall within the scope of the present disclosures; moreover, discharge packets may have similar characteristics as charge packets except, however, a net charge is removed from the battery/cell; for the sake of brevity, the discussion/illustration with respect to discharge packet will not be repeated.
Figure 10N:
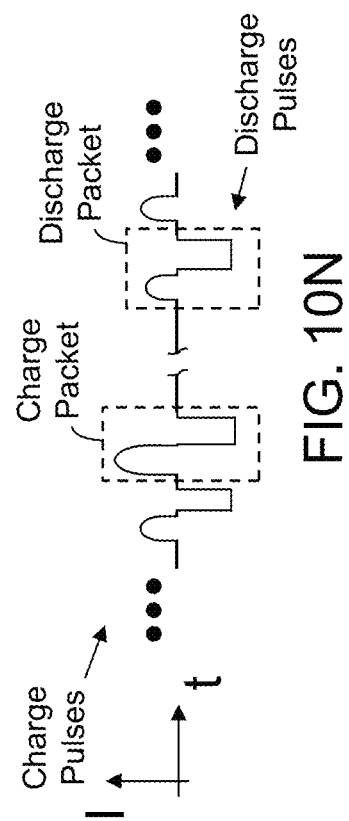
Figure 10K:
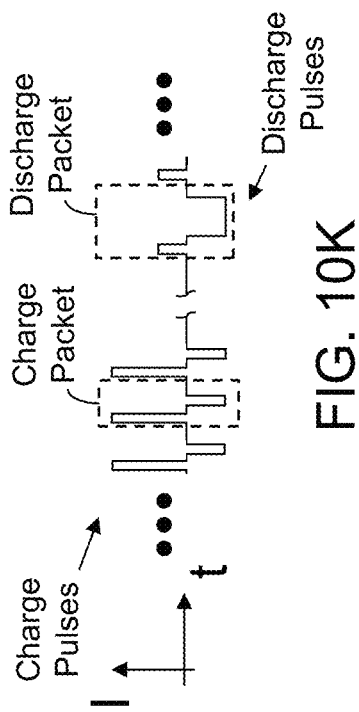
Figure 10M:
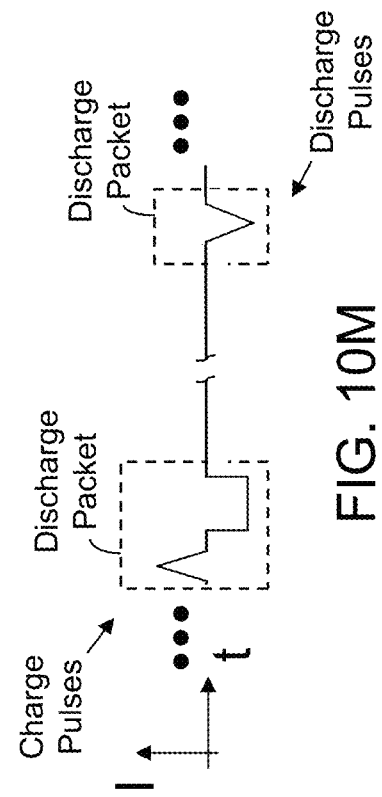
Figure 10P:
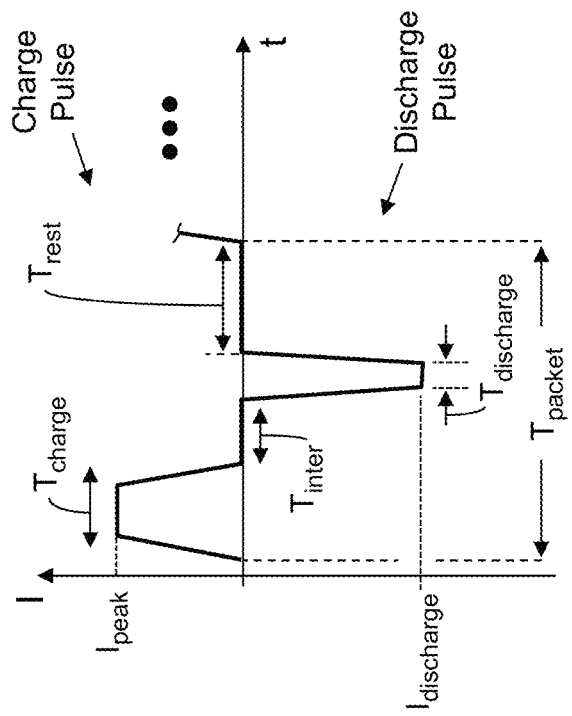
Figure 10O:
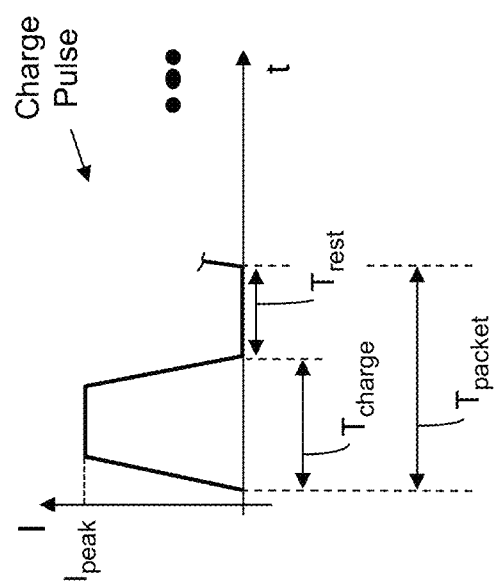

The present disclosures, in another aspect, are directed to circuitry and techniques to adapt, change or modify the charging sequence of a battery based on or using data which is representative of the thickness or change in thickness of the battery. In this aspect of the present disclosures, circuitry and techniques implement adjustments to the charging operation to modify or adapt the charging sequence (via control signals to the charging circuitry) based on or using data which is representative of the thickness or change in thickness of the battery. For example, in one implementation, the adaptive charging techniques or circuitry uses or employs such swelling related data, alone or in connection with other considerations, parameters, constraints or requirements to change, adjust, control or vary the charging current signal(s), including the characteristics thereof. (See, for example, FIG. 8A-8C). Notably, such other considerations, parameters, constraints or requirements include, for example, charge-time parameter (CTP) an overpotential (OP) or full relaxation time (FRT) of the battery, a charge pulse voltage (CPV) or a change in CPV, a partial relaxation time (PRT) of the battery, a temperature of the battery/cell ($T°_{b/c}$), a temperature of the charging circuitry ($T°_{cc}$), a temperature of the housing ($T°_h$), a maximum current applied to the battery during charging operations ($I_{max}$) or a maximum terminal voltage during charging operations ($V_{max}$) (see, for example, FIGS. 8A-8C); a discussion of other parameters, constraints or requirements is provided in application Ser. No. 14/252,422, which, for the sake of brevity, will not be repeated in detail here but is incorporated by reference in its entirety.

In the context of a pulse current charging technique (see, e.g., FIGS. 9A-9D and 10A-10P), the circuitry and techniques, in one implementation, implement, provide, change, adjust or control one or more characteristics of the charging signal applied to the battery (for example, a shape of charge or discharge signal (if any), amplitude thereof, duration thereof, duty cycle thereof, rest period (if any) or sequence of charge or discharge pulses) based on or using data which is representative of the thickness or change in thickness of the battery. For example, the adaptive charging technique and circuitry may measure or monitor the thickness or change (or rate of change) in thickness of the battery (for example, using circuitry or techniques described herein) and, in response thereto (for example, if the thickness or change in thickness of the battery exceeds a predetermined range or value (which, in one exemplary implementation, is 1-10% relative to a given cycle (for example, an initial cycle of a "new" battery), or in another implementation, 2-8%, or is greater than or equal to 3% or 4%, or in a more preferred implementation is greater than or equal to 5%) for a given number of cycles or at a given SOH), adapt, change or modify the charging sequence or operation (for example, reduce the peak current applied to the battery) to manage or control the swelling of the battery. Here, the circuitry and techniques, based on or using data which is representative of the thickness or change in thickness (or rate of change in thickness wherein a predetermined range or value, in one exemplary implementation, is less than 4%, in another implementation is less than 3%, in a preferred implementation is less than 2%, and in a more preferred implementation is less than 1%) of the battery, may adapt, change or adjust one or more characteristics of the charging sequence or operation—for example, reduce the amplitude of the charge pulse (including, for example, terminating the charging sequence), reduce the pulse width, introduce or apply one or more negative pulses, or increase the amplitude or pulse width of the negative pulses (in the event that the sequence includes one or more negative pulses), increase the duration or timing of a rest period after the pulse (in the event that the sequence includes one or more rest periods).

Similarly, in the context of a constant-current, constant-voltage ("CCCV") charging technique or a step charging technique (see, e.g., FIGS. 11A and 11B), in one exemplary implementation, the circuitry and techniques adapt, change, adjust or control the charging operation in accordance with swelling-related data in the event that the thickness or change (or rate of change) in thickness of the battery exceeds a predetermined range or value. In this way, the circuitry determines, changes, adjusts or controls one or more characteristics of the charging signal of a CCCV charging technique or a step charging technique (for example, in the amplitude of the current, the number of steps, to manage or control the thickness or change (or rate of change) in thickness of the battery during the charging operation. For example, in the event that the swelling of the battery exceeds a predetermined range or value, the control circuitry and techniques may reduce the amplitude of the current (including, for example, terminating the charging sequence), increase the number of steps over the charge period, adjust the step width of one or more of the steps, apply or introduce one or more negative pulses into the sequence, or adjust the amplitude or pulse width of one or more negative pulses (i.e., in the event that the CCCV or step charge sequence includes one or more negative pulses). Further, when employing a CCCV charging operation or sequence, the transition from CC to CV may be adjusted or based on the amount of swelling experienced by a battery during, for example, the charging operation.

Notably, in addition to adaptively charging based on whether the thickness or change (or rate of change) in thickness of the battery exceeds a predetermined range or value, such adaptive techniques may also be employed to control or manage the thickness or change (or rate of change) in thickness of the battery so that the battery does not exceed a predetermined range or value. The same technique may be applied in that context. For the sake of brevity, such discussion will not be repeated.

The aforementioned predetermined ranges or values may be stored in memory (for example, in a database or look-up table) during manufacture, test or calibration and accessible to the circuitry or processes during operation (for example, via access of the memory). The memory may be integrated or embedded in other circuitry (for example, control or processing circuitry associated with the battery) or discrete. Further, the memory may be a permanent, semi-permanent or temporary (i.e., until re-programmed). Indeed, in one implementation, the memory may be one time programmable, or data, equations, relationships, or look-up table employed by the control/processing circuitry may be one time programmable (for example, programmed during test or at manufacture). In another implementation, the memory is more than one time programmable and, as such, the predetermined ranges or values employed by the control circuitry may be modified after test or manufacture. The memory may be of any kind or type (for example, EEPROM, Flash, DRAM or SRAM).

In addition to adaptively charging based on the thickness or change (or rate of change) in thickness of the battery, or in lieu thereof, in one implementation, such techniques and circuitry may facilitate meeting or compliance with safety considerations, conditions or "goals" defined by, associated with or corresponding to the battery—for example, managing or controlling SOC of the battery so that the thickness of the battery (or change therein) does not exceed a predetermined range or value (which may depend on the SOH of the battery). In one implementation, the amount of swell is controlled or limited by adjusting the charging signal (as indicated above) or reducing the maximum SOC or the charge level of the battery as a result of a full or complete charging sequence. For example, the thickness of the battery (or change in thickness of the battery) may be limited, controlled or managed by terminating a charging sequence when a SOC of the battery is less than 100%—for example, terminating the charging sequence when the SOC of the battery is, for example, 85% of a previous SOC, rating or the SOC of new battery. In this way, the thickness or change in thickness of the battery may be limited or controlled to not exceed a given amount or change.

As indicated above, the SOC of a battery, for example, a lithium-ion rechargeable battery, is a parameter that is representative or indicates the level of electrical charge available in the battery. It may be characterized as a percentage of the nominal full charge rating of the battery, wherein a 100% SOC indicates that a battery is fully charged and a 0% indicates that the battery is fully discharged. The SOC of the battery may also be characterized as an available charge stored in the battery relative to a maximum available charge stored in the battery—wherein the maximum available charge may change over time as, for example, the battery ages or deteriorates.

In yet another implementation, the circuitry and techniques of the present disclosures adaptively charge a battery to an SOC by correlating a capacity retention to an "acceptable" percentage of swelling and, in response charge the battery to a SOC that is defined by or associated with such fade or change in, loss or reduction of a capacity of the battery. In this way, the thickness or change in thickness (or rate thereof) of the battery is managed or controlled to not exceed a predetermined range or value (for example, to reduce potentially adverse impact or consequences of swelling) by correlating fade related data to a SOC of the battery that controls, limits or maintains the thickness or change in thickness (or rate thereof) of the battery to a predetermined range or value (or not exceed a predetermined range or value).

There are many disclosures described and illustrated herein. While certain implementations, features, attributes and advantages of the disclosures have been described and illustrated, it should be understood that many others, as well as different or similar implementations, features, attributes and advantages of the present disclosures, are apparent from the description and illustrations. As such, the implementations, features, attributes and advantages of the disclosures described and illustrated herein are not exhaustive and it should be understood that such other, similar, as well as different, implementations, features, attributes and advantages of the present disclosures are within the scope of the present disclosures.

Indeed, the present disclosures are neither limited to any single aspect nor implementation thereof, nor to any combinations or permutations of such aspects or implementations. Moreover, each of the aspects of the present disclosures, or implementations thereof, may be employed alone or in combination with one or more of the other aspects of the present disclosures or implementations thereof.

Figure 12B:
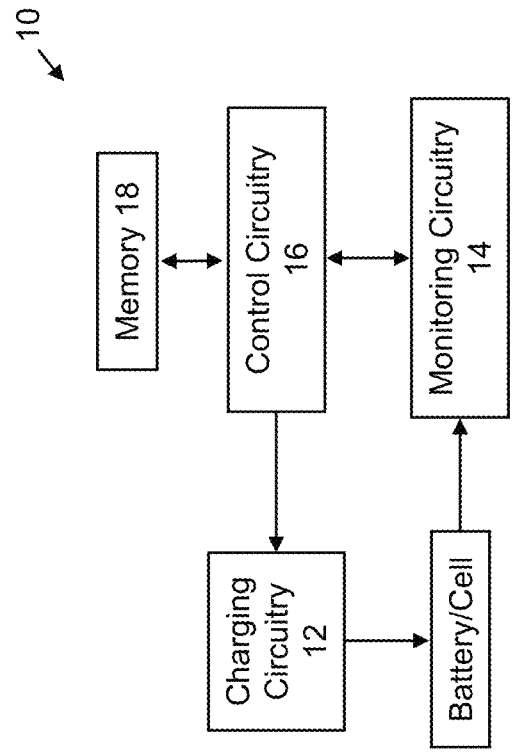
FIGS. 12A-12C illustrate block diagram representations of exemplary adaptive charging circuitry in conjunction with a battery/cell, according to at least certain aspects of certain implementations of the present disclosures, wherein FIG. 12B includes discrete memory coupled to the control circuitry.
Figure 12A:
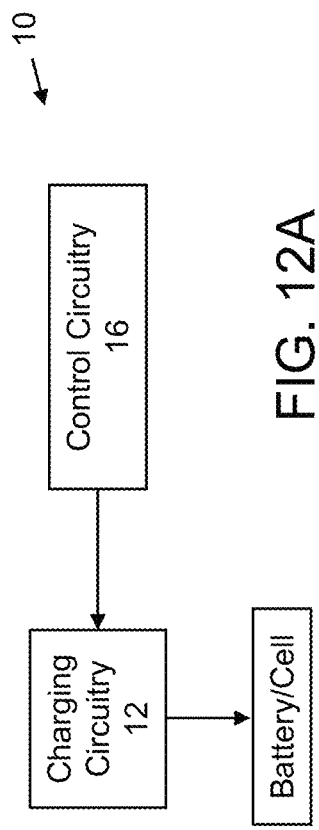
Figure 12C:
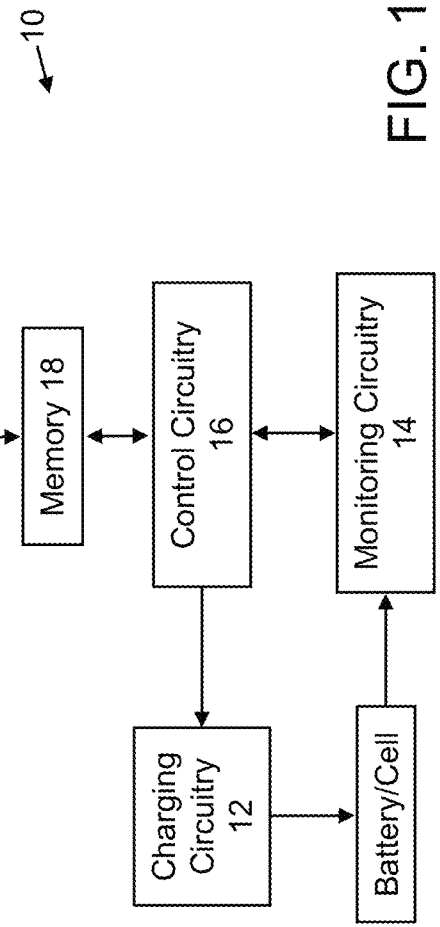

With reference to FIGS. 12A-12C, it should be noted that the circuitry of the present disclosures may include or employ the control/processing circuitry, monitoring circuitry or charging circuitry described and illustrated in PCT Application Serial No. PCT/US2012/30618, U.S. application Ser. No. 13/366,352, U.S. application Ser. No. 13/626, 605, U.S. application Ser. No. 13/657,841, U.S. application Ser. No. 13/747,914, all of which are incorporated herein by reference. For the sake of brevity, the discussion regarding such circuitry, in the context of the techniques of the present disclosures, will not be repeated.

As noted above, the present disclosures may employ any technique or circuitry now known or later developed to estimate SOH of a battery or the impact of SOH on the relationship between a terminal voltage and charge capacity, which may be employed to determine the thickness or change in thickness of the battery. For example, the SOH of the battery may be calculated or estimated using the techniques set forth in, for example, PCT App. Serial No. PCT/US2012/30618 and U.S. application Ser. Nos. 13/366, 352 and 13/657,841.

Notably, "circuitry", means, among other things, a circuit (whether integrated or otherwise), a group of such circuits, one or more processors, one or more state machines, one or more processors implementing software, one or more gate arrays, programmable gate arrays or field programmable gate arrays, or a combination of one or more circuits (whether integrated or otherwise), one or more state machines, one or more processors, one or more processors implementing software, one or more gate arrays, programmable gate arrays or field programmable gate arrays. The term "data" means, among other things, a current or voltage signal(s) (plural or singular) whether in an analog or a digital form.

Further, control/processing circuitry (employed to implement the operations or techniques described herein) may perform or execute one or more applications, routines, programs or data structures that implement particular methods, techniques, tasks or operations described and illustrated herein. The functionality of the applications, routines or programs may be combined or distributed. In addition, the applications, routines or programs may be implemented by the control circuitry using any programming language whether now known or later developed, including, for example, assembly, FORTRAN, C, C++, and BASIC, whether compiled or uncompiled code; all of which are intended to fall within the scope of the present disclosures.

Moreover, monitoring circuitry and control/processing circuitry (which is employed to implement the operations or techniques described herein) may share circuitry with each other as well as with other elements. Moreover, such circuitry may be distributed among a plurality of integrated circuits which may also perform one or more other operations, which may be separate and distinct from that described herein.

It should be further noted that the various circuits and circuitry disclosed herein may be described using computer aided design tools and expressed (or represented), as data or instructions embodied in various computer-readable media, in terms of their behavioral, register transfer, logic component, transistor, layout geometries, or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats or languages now known or later developed. Computer-readable media in which such formatted data or instructions may be embodied include, but are not limited to, non-volatile storage media in various forms (e.g., optical, magnetic or semiconductor storage media) and carrier waves that may be used to transfer such formatted data or instructions through wireless, optical, or wired signaling media or any combination thereof. Examples of transfers of such formatted data or instructions by carrier waves include, but are not limited to, transfers (uploads, downloads, e-mail, etc.) over the Internet or other computer networks via one or more data transfer protocols (e.g., HTTP, FTP, SMTP, etc.).

Indeed, when received within a computer system via one or more computer-readable media, such data or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations using computer aided design or testing tools. The simulation of the charging circuitry, control circuitry or monitoring circuitry, or techniques implemented thereby, may be implemented by a computer system wherein characteristics and operations of such circuitry, and techniques implemented thereby, are imitated, replicated or predicted via a computer system. The present disclosures are also directed to such simulations of the inventive charging circuitry, control circuitry or monitoring circuitry, or techniques implemented thereby, and, as such, are intended to fall within the scope of the present disclosures. The computer-readable media corresponding to such simulations or testing tools are also intended to fall within the scope of the present disclosures.

The present disclosure may be embodied in other specific forms without departing from its spirit or essential characteristics. The described implementations are to be considered in all respects only as illustrative and not restrictive. The scope of the disclosure is, therefore, indicated by the appended claims rather than by the foregoing description. All changes which come within the meaning and range of equivalency of the claims are to be embraced within their scope

What is claimed is:

1. A method for estimating swelling of a rechargeable battery, the method comprising:

determining capacity fade of the rechargeable battery in use, the capacity fade representing a reduction of capacity of the rechargeable battery;

estimating swelling of the rechargeable battery using the determined capacity fade of the rechargeable battery;

adjusting a charging sequence for the rechargeable battery based at least in part on the swelling of the rechargeable battery estimated using the determined capacity fade of the rechargeable battery in use, wherein adjusting the charging sequence is selected from operations consisting of: reducing an amplitude of a charge pulse, reducing a width of a charge pulse, applying one or more negative pulses, increasing an amplitude of a negative pulse, increasing a width of a negative pulse, increasing a duration of a rest period, changing a timing of a rest period, and any combinations thereof; and charging the rechargeable battery using the adjusted charging sequence.

2. The method of claim 1, wherein estimating the swelling comprises applying a relationship for predicting battery swelling from battery capacity fade that was obtained by:
(i) charging and discharging one or more sample rechargeable batteries for one or more charge cycles;
(ii) measuring capacity of the one or more sample rechargeable batteries;
(iii) measuring swelling of the one or more sample rechargeable batteries;
(iv) repeating (i)-(iii) one or more times, thereby obtaining two or more data points corresponding to capacity fade and swelling in two or more charge cycles for the one or more sample rechargeable batteries; and
(v) forming the relationship for predicting battery swelling from battery capacity fade using the two or more data points.

3. The method of claim 2, further comprising:
storing the relationship in a memory; and
retrieving the relationship from memory for estimating the swelling.

4. The method of claim 1, wherein determining capacity fade of a rechargeable battery comprises determining capacity fade in two or more charge cycles.

5. The method of claim 1, wherein adjusting the charging sequence reduces the estimated swelling of the rechargeable battery.

6. The method of claim 1, wherein adjusting the charging sequence comprises adjusting one or more characteristics of a charging signal of a constant-current, constant-voltage (CCCV) charging technique or a step charging technique.

7. The method of claim 6 further comprising:
determining that the swelling of the battery exceeds a predetermined range or value, wherein adjusting the charging sequence comprises adjusting the charging sequence based on the determination that the swelling of the battery exceeds the predetermined range or value.

8. The method of claim 1, wherein reducing a state of charge at which the charging sequence is terminated comprises terminating a charging sequence when the SOC of the battery reaches 85% or lower of a previous or initial state of charge (SOC) of the battery.

9. The method of claim 1, wherein adjusting the charging sequence comprises applying one or more negative pulses.

10. The method of claim 1, wherein adjusting the charging sequence comprises increasing the amplitude of the negative pulse and wherein charging the rechargeable battery using the adjusted charging sequence comprises charging the battery by applying to the rechargeable battery a series of pulses including positive pulses which inject charge into the rechargeable battery and the negative pulse which removes charge from the rechargeable battery.

11. The method of claim 1, wherein adjusting the charging sequence comprises increasing the width of the negative pulse and wherein charging the rechargeable battery using the adjusted charging sequence comprises charging the battery by applying to the rechargeable battery a series of pulses including positive pulses that inject charge into the rechargeable battery and the negative pulse that removes charge from the rechargeable battery.

12. The method of claim 1, wherein adjusting the charging sequence comprises increasing the duration of the rest period, wherein charging the rechargeable battery using the adjusted charging sequence comprises charging the battery by applying to the rechargeable battery first and second positive pulses that inject charge into the rechargeable battery, and wherein the first and second positive pulses are separated by the rest period.

13. A method for estimating swelling of a rechargeable battery, the method comprising:
determining capacity fade of the rechargeable battery in use, the capacity fade representing a reduction of capacity of the rechargeable battery;
estimating swelling of the rechargeable battery using the determined capacity fade of the rechargeable battery;
adjusting a charging sequence for the rechargeable battery based at least in part on the swelling of the rechargeable battery estimated using the determined capacity fade of the rechargeable battery in use, wherein adjusting the charging sequence is selected from operations consisting of: reducing an amplitude of a charge pulse, reducing a state of charge at which the charging sequence is terminated, reducing a width of a charge pulse, applying one or more negative pulses, increasing an amplitude of a negative pulse, increasing a width of a negative pulse, increasing a duration of a rest period, changing a timing of a rest period, and any combinations thereof; and
charging the rechargeable battery using the adjusted charging sequence, wherein the charging sequence comprises a step charging technique and wherein adjusting the charging sequence further comprises increasing a number of steps of charge current in the step charging technique based at least in part on the swelling of the rechargeable battery.

14. A method for estimating swelling of a rechargeable battery, the method comprising:
determining capacity fade of the rechargeable battery in use, the capacity fade representing a reduction of capacity of the rechargeable battery;
estimating swelling of the rechargeable battery using the determined capacity fade of the rechargeable battery;
adjusting a charging sequence for the rechargeable battery based at least in part on the swelling of the rechargeable battery estimated using the determined capacity fade of the rechargeable battery in use, wherein adjusting the charging sequence is selected from operations consisting of: reducing an amplitude of a charge pulse, reducing a state of charge at which the charging sequence is terminated,-reducing a width of a charge pulse, applying one or more negative pulses, increasing an amplitude of a negative pulse, increasing a width of a negative pulse, increasing a duration of a rest period, changing a timing of a rest period, and any combinations thereof; and charging the rechargeable battery using the adjusted charging sequence, wherein adjusting the charging sequence is at least partially based on a parameter selected from the group consisting of: an over-potential (OP) of the battery, a full relaxation time (FRT) of the battery, a charge pulse voltage (CPV), a change in CPV, a partial relaxation time (PRT) of the battery.

15. A system for estimating swelling of a rechargeable battery comprising:
(a) charging circuitry configured to apply a charging sequence for the rechargeable battery;
(b) measurement circuitry configured to measure voltage or charge passing at terminals of the rechargeable battery; and
(c) logic configured to:
determine capacity fade of the rechargeable battery in use, the capacity fade representing a reduction of capacity of the rechargeable battery, wherein the logic determines capacity fade using measured voltage and/or charge from the measurement circuitry;
estimate swelling of the rechargeable battery using the determined capacity fade of the rechargeable battery;
adjust a charging sequence for the rechargeable battery based at least in part on the swelling of the rechargeable battery estimated using the determined capacity fade of the rechargeable battery in use, wherein the logic is configured to adjust the charging sequence by: reducing an amplitude of a charge pulse, reducing a width of a charge pulse, applying one or more negative pulses, increasing an amplitude of a negative pulse, increasing a width of a negative pulse, increasing a duration of a rest period, changing a timing of a rest period, or a combination thereof; and
charge the rechargeable battery using the adjusted charging sequence.

16. The system of claim 15, wherein estimating the swelling comprises applying the determined capacity fade to a relationship for predicting battery swelling from battery capacity fade.

17. The system of claim 15, wherein the logic is further configured to adjust the charging sequence, applied by the charging circuitry, based at least in part on the estimated swelling of the rechargeable battery.

18. The system of claim 15, wherein the logic is further configured to obtain a relationship for predicting battery swelling from battery capacity fade.

* * * * *